(12) United States Patent
Saka

(10) Patent No.: US 10,879,165 B2
(45) Date of Patent: Dec. 29, 2020

(54) SEMICONDUCTOR DEVICE AND METHOD FOR MANUFACTURING SEMICONDUCTOR DEVICE WITH LOW-PERMITTIVITY LAYERS

(71) Applicant: SONY CORPORATION, Tokyo (JP)

(72) Inventor: Naoki Saka, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 15/762,172

(22) PCT Filed: Sep. 2, 2016

(86) PCT No.: PCT/JP2016/075902
§ 371 (c)(1),
(2) Date: Mar. 22, 2018

(87) PCT Pub. No.: WO2017/064937
PCT Pub. Date: Apr. 20, 2017

(65) Prior Publication Data
US 2018/0277479 A1    Sep. 27, 2018

(30) Foreign Application Priority Data
Oct. 16, 2015  (JP) .................................. 2015-204772

(51) Int. Cl.
*H01L 23/522* (2006.01)
*H01L 23/532* (2006.01)
(Continued)

(52) U.S. Cl.
CPC ...... *H01L 23/5225* (2013.01); *H01L 21/7682* (2013.01); *H01L 21/76895* (2013.01);
(Continued)

(58) Field of Classification Search
CPC ... H01L 23/5225; H01L 23/66; H01L 23/535; H01L 23/528; H01L 23/532;
(Continued)

(56) References Cited

U.S. PATENT DOCUMENTS 6,093,633 A * 7/2000 Matsumoto ......... H01L 21/7682
257/E21.581
6,291,030 B1 * 9/2001 Chao .................... H01L 21/7682
427/579

(Continued)

FOREIGN PATENT DOCUMENTS

| JP | 08-125020 | * 5/1996 | ........... H01L 21/768 |
| JP | HEI 08-125020 | 5/1996 | |

(Continued)

OTHER PUBLICATIONS

International Search Report prepared by the Japan Patent Office dated Nov. 7, 2016, for International Application No. PCT/JP2016/075902.

*Primary Examiner* — Khiem D Nguyen
(74) *Attorney, Agent, or Firm* — Sheridan Ross P.C.

(57) ABSTRACT

A semiconductor device in which the generation of a distortion of a signal is suppressed, and a method for manufacturing the semiconductor device are disclosed. The semiconductor device includes a transistor region in which a field effect transistor is provided; and an interconnection region in which a metal layer electrically connected to the field effect transistor is provided. The interconnection region includes an insulating layer provided between the metal layer and a substrate, and a low-permittivity layer provided in the insulating layer below the metal layer and having a lower permittivity than the insulating layer.

12 Claims, 30 Drawing Sheets

(51) Int. Cl.
*H01L 21/768* (2006.01)
*H01L 21/84* (2006.01)
*H01L 23/528* (2006.01)
*H01L 23/535* (2006.01)
*H01L 23/66* (2006.01)
*H01L 27/12* (2006.01)
*H01L 23/485* (2006.01)

(52) U.S. Cl.
CPC ............ *H01L 21/84* (2013.01); *H01L 23/528* (2013.01); *H01L 23/5222* (2013.01); *H01L 23/535* (2013.01); *H01L 23/53295* (2013.01); *H01L 23/66* (2013.01); *H01L 27/1203* (2013.01); *H01L 23/485* (2013.01)

(58) Field of Classification Search
CPC ........... H01L 23/5226; H01L 23/53295; H01L 21/768; H01L 21/76802; H01L 21/76877; H01L 21/76895; H01L 21/76897; H01L 21/823475; H01L 29/4991; H01L 29/515; H01L 29/0649–0653; H01L 2221/1042–1047; H01L 21/7682; H01L 23/5222
See application file for complete search history.

(56) References Cited

U.S. PATENT DOCUMENTS

| | | | | |
|---|---|---|---|---|
| 6,917,109 | B2* | 7/2005 | Lur | H01L 21/7682 257/522 |
| 7,553,756 | B2* | 6/2009 | Hayashi | H01L 21/76802 257/522 |
| 7,879,683 | B2* | 2/2011 | Al-Bayati | H01L 21/3105 257/E21.573 |
| 8,053,893 | B2* | 11/2011 | Noguchi | H01L 21/314 257/760 |
| 10,157,778 | B2* | 12/2018 | Tsai | H01L 21/76805 |
| 10,211,146 | B2* | 2/2019 | He | H01L 23/5222 |
| 2002/0000663 | A1 | 1/2002 | Nakayama | |
| 2004/0094821 | A1* | 5/2004 | Lur | H01L 21/76807 257/522 |
| 2004/0119134 | A1* | 6/2004 | Goldberg | H01L 21/288 257/508 |
| 2004/0232552 | A1* | 11/2004 | Wang | H01L 21/76807 257/758 |
| 2009/0206379 | A1* | 8/2009 | Kitazaki | H01G 4/1245 257/295 |
| 2011/0298021 | A1* | 12/2011 | Tada | H01L 27/108 257/288 |
| 2012/0181695 | A1* | 7/2012 | Haneda | H01L 21/2855 257/751 |
| 2013/0341793 | A1* | 12/2013 | Suzumura | H01L 23/5384 257/751 |
| 2014/0199831 | A1* | 7/2014 | Hotta | H01L 21/76808 438/622 |
| 2014/0264896 | A1* | 9/2014 | Lu | H01L 23/5329 257/773 |
| 2015/0028409 | A1* | 1/2015 | Kuge | H01L 27/11524 257/316 |
| 2016/0043223 | A1* | 2/2016 | Xie | H01L 29/785 257/401 |
| 2016/0141240 | A1* | 5/2016 | Saka | H01L 29/41758 257/401 |

FOREIGN PATENT DOCUMENTS

| | | |
|---|---|---|
| JP | HEI 10-189716 | 7/1998 |
| JP | HEI 11-067906 | 3/1999 |
| JP | HEI 11-097524 | 4/1999 |
| JP | HEI 11-154675 | 6/1999 |
| JP | 2002-359369 | 12/2002 |
| JP | 2006-324689 | 11/2006 |

* cited by examiner

SEMICONDUCTOR DEVICE AND METHOD FOR MANUFACTURING SEMICONDUCTOR DEVICE WITH LOW-PERMITTIVITY LAYERS

CROSS REFERENCE TO RELATED APPLICATIONS

This application is a national stage application under 35 U.S.C. 371 and claims the benefit of PCT Application No. PCT/JP2016/075902 having an international filing date of 2 Sep. 2016, which designated the United States, which PCT application claimed the benefit of Japan Patent Application No. 2015-204772 filed 16 Oct. 2015, the entire disclosures of each of which are incorporated herein by reference.

TECHNICAL FIELD

The present disclosure relates to a semiconductor device and a method for manufacturing a semiconductor device.

BACKGROUND ART

A field effect transistor (FET) is used as, for example, a switch element of a radio frequency device. A radio frequency switch (RF-SW) is a switch that switches the transmission and reception of a radio frequency (RF) to ON or OFF, and is mainly used for a front end of a mobile communication terminal such as a mobile phone.

Here, in a case where a field effect transistor is used for a radio frequency switch, the field effect transistor is required to reduce the loss of a passing radio frequency signal and not to generate a signal other than the passing radio frequency signal (that is, not to cause a distortion of the signal).

For example, Patent Literature 1 below discloses a technology in which a space is formed around a gate electrode of a field effect transistor, and thereby the parasitic capacitance between the gate electrode and a contact plug is reduced and the loss of a passing radio frequency signal is reduced.

CITATION LIST

Patent Literature

Patent Literature 1: JP 2002-359369A

DISCLOSURE OF INVENTION

Technical Problem

However, in the technology disclosed in Patent Literature 1, it has been difficult to, in a signal that has passed through the field effect transistor, suppress the generation of a signal other than an input or output signal (that is, a distortion of a signal).

Thus, the present disclosure proposes a new and improved semiconductor device that can suppress the generation of a signal other than an input or output signal and a method for manufacturing the semiconductor device.

Solution to Problem

According to the present disclosure, there is provided a semiconductor device including: a transistor region in which a field effect transistor is provided; and an interconnection region in which a metal layer electrically connected to the field effect transistor is provided. The interconnection region includes an insulating layer provided between the metal layer and a substrate, and a low-permittivity layer provided in the insulating layer below the metal layer and having a lower permittivity than the insulating layer.

In addition, according to the present disclosure, there is provided a method for manufacturing a semiconductor device, including: a step of forming a field effect transistor in a transistor region; a step of filling, with an insulating layer, an interconnection region in which a metal layer to be electrically connected to the field effect transistor is to be provided and the transistor region; a step of forming, in the insulating layer, a low-permittivity layer having a lower permittivity than the insulating layer; and a step of forming the metal layer on the low-permittivity layer.

According to the present disclosure, the nonlinear parasitic capacitance generated between at least one of an interconnection and an electrode, and a substrate in a semiconductor device can be reduced. Thereby, nonlinearity in an input or output signal of the semiconductor device can be reduced.

Advantageous Effects of Invention

As described above, according to the present disclosure, it is possible to suppress the generation of a signal other than an input or output signal.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 4 is a circuit diagram of an equivalent circuit when the SPST switch is ON.

MODE(S) FOR CARRYING OUT THE INVENTION

Figure 1:
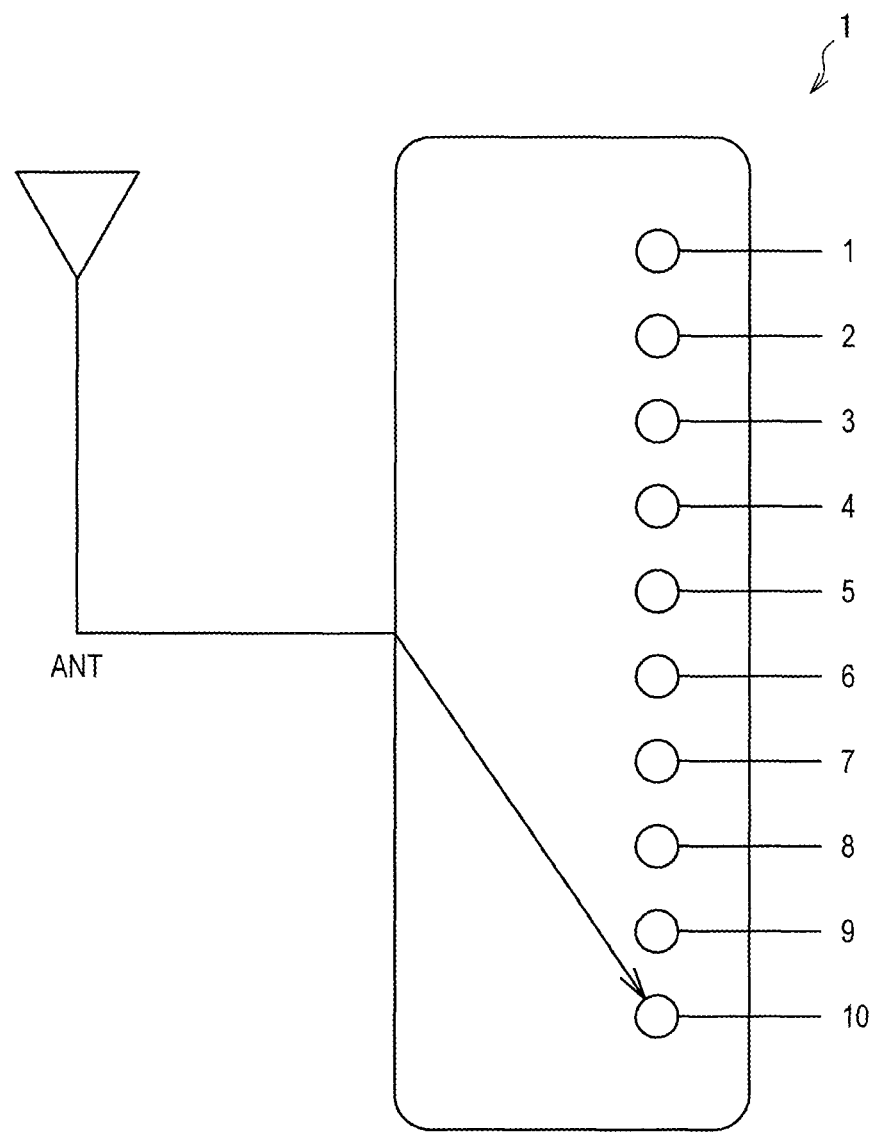
FIG. 1 is a conceptual diagram showing a configuration of a radio frequency switch that includes a semiconductor device according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Figure 2:
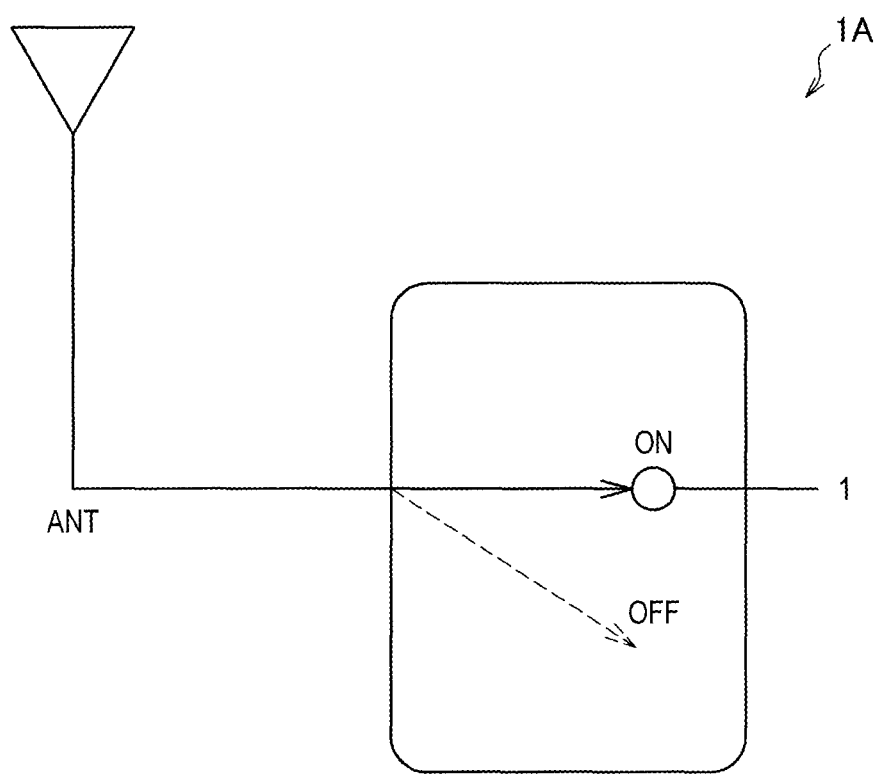
FIG. 2 is a conceptual diagram showing a configuration of a radio frequency switch that includes a semiconductor device according to an embodiment of the present disclosure.

Note that the description is given in the following order.
0. Technical background
1. Configuration of semiconductor device
1.1. First structural example
1.2. Second structural example
1.3. Third structural example
1.4. Fourth structural example
1.5. Fifth structural example
1.6. Sixth structural example
2. Method for manufacturing semiconductor device
3. Usage example 0. Technical Background First, the technical background of the present disclosure is described with reference to FIG. 1 to FIG. 7. FIG. 1 and FIG. 2 are conceptual diagrams showing the configurations of radio frequency switches each of which includes a semiconductor device according to an embodiment of the present disclosure.

Each of the radio frequency switches shown in FIG. 1 and FIG. 2 is used for a front end of a personal digital assistant such as a mobile phone. Radio frequency switches are categorized into various configurations, such as single-pole single-through (SPST), single-pole double-through (SPDT), SP3T, and SPNT (N being a natural number), on the basis of the number of ports for inputting or outputting.

FIG. 1 shows a configurational example of a single-pole ten-through (SP10T) switch. As shown in FIG. 1, an SP10T switch 1 includes one pole connected to an antenna ANT and ten contacts. Further, FIG. 2 shows a configurational example of a single-pole single-through (SPST) switch. As shown in FIG. 2, an SPST switch 1A includes one pole connected to an antenna ANT and one contact of which the ON or OFF can be switched.

Note that, although the radio frequency switch 1 can take various configurations, a radio frequency switch of any configuration can be fabricated by combining the basic circuit configuration of the SPST switch 1A shown in FIG. 2.

Figure 3:
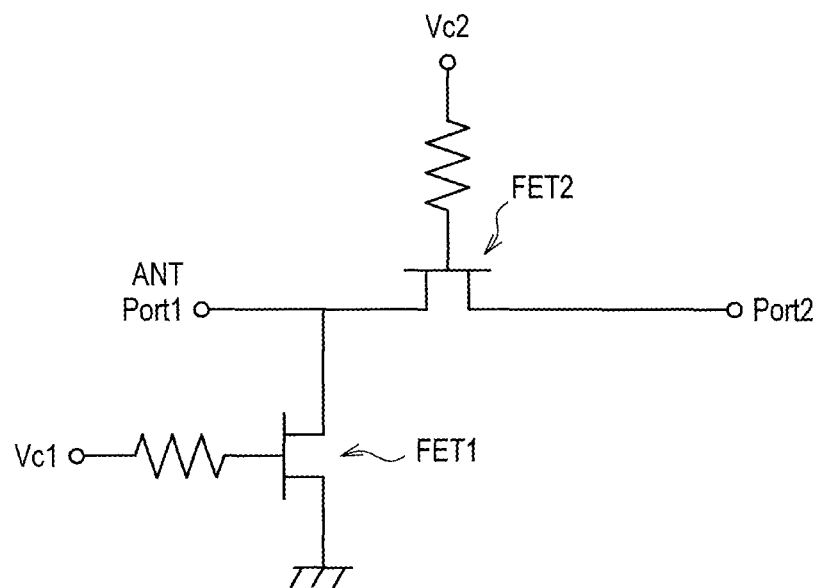
FIG. 3 is a circuit diagram of an equivalent circuit of an SPST switch shown in FIG. 2.

FIG. 3 is a circuit diagram of an equivalent circuit of the SPST switch 1A shown in FIG. 2. As shown in FIG. 3, the SPST switch 1A includes, for example, a first port Port1 connected to the antenna ANT, a second port Port2, a first switching element FET1, and a second switching element FET2. Note that the first switching element FET1 is provided between the first port Port1 and the ground, and the second switching element FET2 is provided between the first port Port1 and the second port Port2.

The ON and OFF of the SPST switch 1A are controlled by control voltages Vc1 and Vc2 being applied to the gates of the first switching element FET1 and the second switching element FET2 via resistances, respectively.

Figure 4:
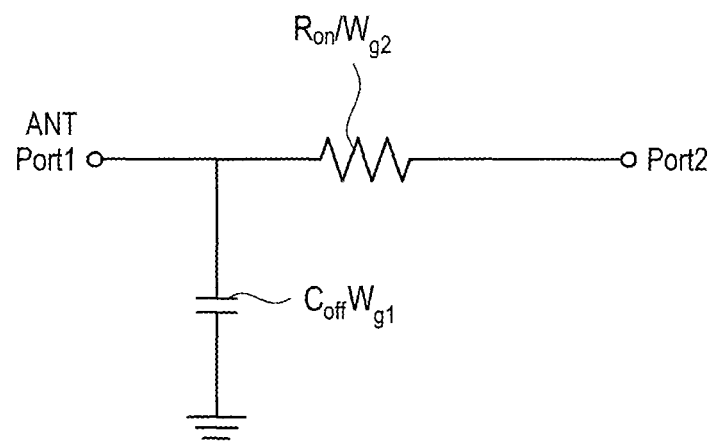
Figure 5:
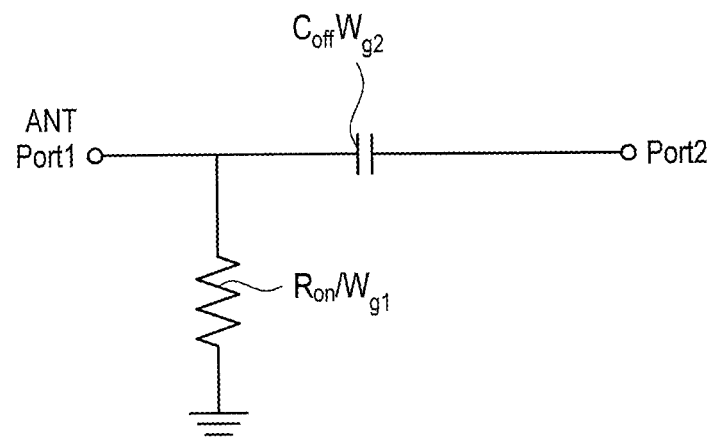
FIG. 5 is a circuit diagram of an equivalent circuit when the SPST switch is OFF.

An equivalent circuit when the SPST switch 1 is ON or OFF can be expressed as FIG. 4 and FIG. 5, using the resistance value $R_{on}$ (Ω·mm) of the field effect transistor per unit length, the capacitance value $C_{off}$ (fF/mm) of the field effect transistor per unit length, and the gate widths $W_{g1}$ and $W_{g1}$ (mm). FIG. 4 is a circuit diagram of an equivalent circuit when the SPST switch 1A is ON, and FIG. 5 is a circuit diagram of an equivalent circuit when the SPST switch 1A is OFF.

That is, in a case where the SPST switch 1A is in the ON state, as shown in FIG. 4, the second switching element FET2 is in a conduction state, and the first switching element FET1 is in a non-conduction state. On the other hand, in a case where the SPST switch 1A is in the OFF state, as shown in FIG. 5 the first switching element FET1 is in a conduction state, and the second switching element FET2 is in a non-conduction state.

Referring to FIG. 4 and FIG. 5, the ON resistances of the first switching element FET1 and the second switching element FET2 can be expressed as $R_{on}/W_{g1}$ and $R_{on}/W_{g2}$, respectively. Further, the OFF capacitances of the first switching element FET1 and the second switching element FET2 can be expressed as $C_{off}*W_{g1}$ and $C_{off}*W_{g1}$, respectively. That is, the ON resistance is in inverse proportion to the gate widths $W_{g1}$ and $W_{g2}$, and the OFF capacitance is in proportion to the gate widths $W_{g1}$ and $W_{g2}$.

Here, in the radio frequency switch, it is required not to generate a signal other than a passing radio frequency signal (that is, not to cause a distortion of a signal). In particular, it is required to suppress distortions of a signal referred to as a harmonic distortion and an intermodulation distortion.

Figure 6:
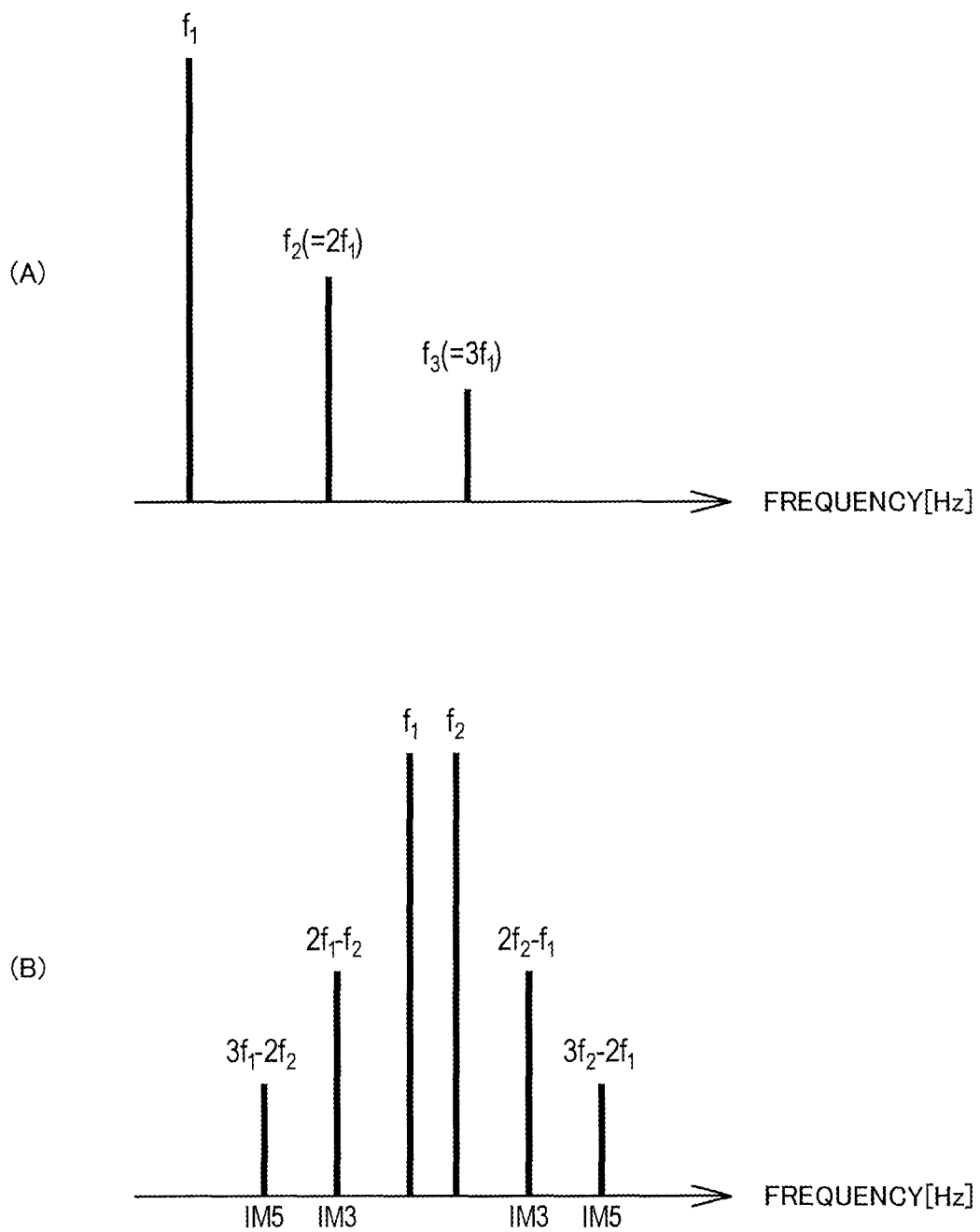
FIG. 6 is an explanatory diagram describing harmonic distortions and intermodulation distortions.

Harmonic distortions and intermodulation distortions will now be described with reference to FIG. 6. FIG. 6 is an explanatory diagram describing harmonic distortions and intermodulation distortions.

In an ideal radio frequency switch, an output signal with a frequency of $f_1$ is outputted for an input signal with the frequency of $f_1$. However, in an actual radio frequency switch, the ON resistance and the OFF capacitance of the field effect transistor have nonlinearity; therefore, as shown in (A) of FIG. 6, distortions of a signal, such as $f_2$ and $f_3$ are generated in an output signal.

Specifically, as shown in (A) of FIG. 6, in a case where a signal with a specific frequency $f_1$ has passed through a nonlinear circuit, an N-th harmonic distortion with an N-times frequency $f_n$ ($=Nf_1$) (N being a natural number of more than or equal to 2) is included in an outputted signal, in addition to a basic signal with the frequency of $f_1$. In particular, it is required that, among harmonic distortions, a second harmonic distortion with a twice frequency $f_2$ ($=2f_1$) and a third harmonic distortion with a three-times frequency $f_3$ ($=3f_1$) be suppressed, because they have large influence on transmission and reception signals of communication equipment.

Further, as shown in (B) of FIG. 6, in a case where two input signals with frequencies of $f_1$ and $f_2$ pass through a nonlinear circuit and two second harmonics with frequencies of $2f_1$ and $2f$, are generated, third-order intermodulation distortions (IM3) with frequencies of $2f_1-f_2$ and $2f_2-f_1$ are generated due to intermodulation between the second harmonics and the input waves. Similarly, fifth-order intermodulation distortions (IM5) with frequencies of $3f_1-2f_2$ and $3f_2-2f_1$ are generated due to intermodulation between the third harmonics and the second harmonics.

The generation of intermodulation distortions is described in more detail using mathematical formulae. An output signal from a nonlinear circuit can, for example as shown in Formula 1 below, be expressed by Taylor expansion as the sum of terms of the zeroth order and the first order, which are linear terms, and terms of the second and subsequent orders, which are nonlinear terms.

[Math. 1]

$$V_0 = f(V_i) = a_0 + a_1 V_i + a_2 V_i^2 + a_3 V_i^3 + \ldots \quad \text{(Formula 1)}$$

Here, if two input signals $V_1$ and $V_2$ represented by Formula 2 below are substituted for $V_0$, Formula 3 below is given.

[Math. 2]

$$V_1 = E_1 \cos\omega_1 t \quad \text{(Formula 2)}$$
$$V_2 = E_2 \cos\omega_2 t$$

[Math. 3]

$$V_0 = a_0 + a_1 \cdot E_1 \cdot \cos\omega_1 t + a_2 \cdot E_2 \cdot \cos\omega_2 t + \quad \text{(Formula 3)}$$
$$\frac{a_2}{2}(E_1^2 + E_2^2) + \frac{a_2}{2}(E_1^2 \cdot \cos2\omega_1 t + E_2^2 \cdot \cos2\omega_2 t) +$$
$$a_2 \cdot E_1 \cdot E_2 \{\cos(\omega_1 - \omega_2)t + \cos(\omega_1 + \omega_2)t\} +$$
$$a_3\left(\frac{3}{4}E_1^3 + \frac{3}{2}E_1 \cdot E_2^2\right) \cdot \cos\omega_1 t +$$
$$a_3\left(\frac{3}{4}E_2^3 + \frac{3}{2}E_1^2 \cdot E_2\right) \cdot \cos\omega_2 t -$$
$$\frac{a_3}{4}E_1^3 \cdot \cos3\omega_1 t - \frac{a_3}{4}E_2^3 \cdot \cos3\omega_2 t +$$
$$\frac{3}{4}a_3 \cdot E_1^2 \cdot E_2 \{\cos(2\omega_1 - \omega_2)t - \cos(2\omega_1 + \omega_2)t\} +$$
$$\frac{3}{4}a_3 \cdot E_1 \cdot E_2^2 \{\cos(2\omega_2 - \omega_1)t - \cos(2\omega_2 + \omega_1)t\} + \ldots$$

As shown in Formula 3, it can be seen that signals with frequencies of $2\omega_1-\omega_2$ and $2\omega_2-\omega_1$, which are not included in the input signal $V_1$ or $V_2$, are included in the output signal $V_0$ from the nonlinear circuit. That is, these signals with frequencies of $2\omega_1-\omega_2$, and $2\omega_2-\omega_1$ correspond to the third-order intermodulation distortions described above. Similarly, it is presumed that also fifth-order intermodulation distortions have been generated from harmonic distortions of the input signals. Therefore, it can be seen that, in a nonlinear circuit, a signal with a frequency that is not originally included in an input signal is created in the interior of the circuit.

In order to suppress the influence of such harmonic distortions and intermodulation distortions generated from a nonlinear circuit, using a filter (for example, a band-pass filter or the like) that attenuates frequencies other than the frequency of the output signal is proposed, for example. However, in such a method, it has been difficult to sufficiently suppress the influence of harmonic distortions and intermodulation distortions on the output signal.

Figure 7:
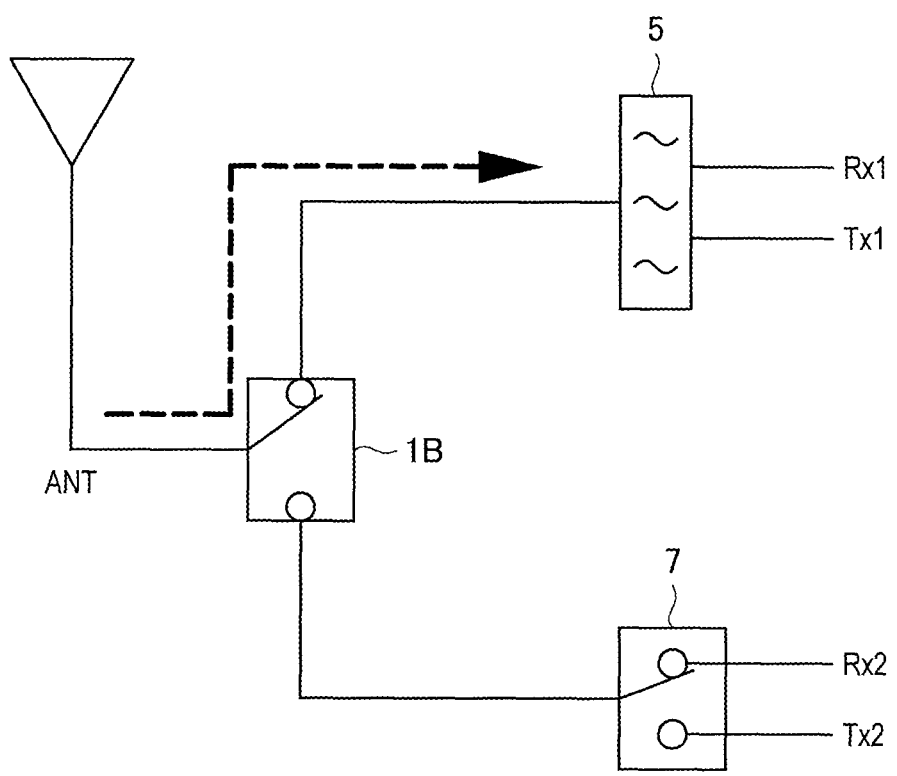
FIG. 7 is a conceptual diagram describing a multiband-adapted switching element adapted for each of a 3G standard and a 2G standard.

The above will now be specifically described with reference to FIG. 7. FIG. 7 is a conceptual diagram describing a multiband-adapted switching element adapted for each of the 3G standard and the 2G standard.

As shown in FIG. 7, a switching element 1B makes switching between a circuit of the 3G standard (for example, W-CDMA (registered trademark) or the like) that receives a reception signal Rx1 and transmits a transmission signal Tx1 and a circuit of the 2G standard (for example, GSM (registered trademark) or the like) that receives a reception signal Rx2 and transmits a transmission signal Tx2. In the circuit of the 2G standard, the transmission and reception signals are sorted by another switching element 7; and in the circuit of the 3G standard, the transmission and reception signals are sorted by a duplexer 5 that allows only the frequency bands of the transmission and reception signals to pass.

For example, a case where the duplexer 5 allows 1950 MHz to pass as the frequency of the transmission signal and allows 2140 MHz to pass as the frequency of the reception signal is supposed. Here, in a case where a transmission signal of 1950 MHz and an interfering signal of 1760 MHz have entered the switching element 1B simultaneously, a signal with a frequency of 2140 MHz (=2×1950−1760), which is close to the reception signal, is generated as a third-order intermodulation distortion. Such a third-order intermodulation distortion passes through the duplexer 5, and consequently becomes a noise source to the reception signal.

In particular, the circuit of the 3G standard is always in the ON state, unlike the circuit of the 2G standard of which the ON and OFF are switched by the switching element 7. Hence, in a case where an intermodulation distortion with a frequency similar to the frequency of the transmission or reception signal is generated, the generated intermodulation distortion passes through the duplexer 5 in the circuit of the 3G standard, and flows into a transmitting or receiving circuit.

Therefore, even in a case where a filter that attenuates signals with frequencies other than a prescribed frequency band is used, it has been difficult to sufficiently suppress the influence of harmonic distortions and intermodulation distortions. Hence, a switching element with low nonlinearity in which harmonic distortions and intermodulation distortions are less likely to be generated has been desired.

A semiconductor device according to an embodiment of the present disclosure can reduce nonlinearity in the semiconductor device by reducing the nonlinear parasitic capacitance generated between at least one of an interconnection and an electrode, and a substrate. Thereby, the semiconductor device according to the present embodiment can suppress the generation of harmonic distortions and intermodulation distortions in an output signal.

1. Configuration of Semiconductor Device

Figure 8:
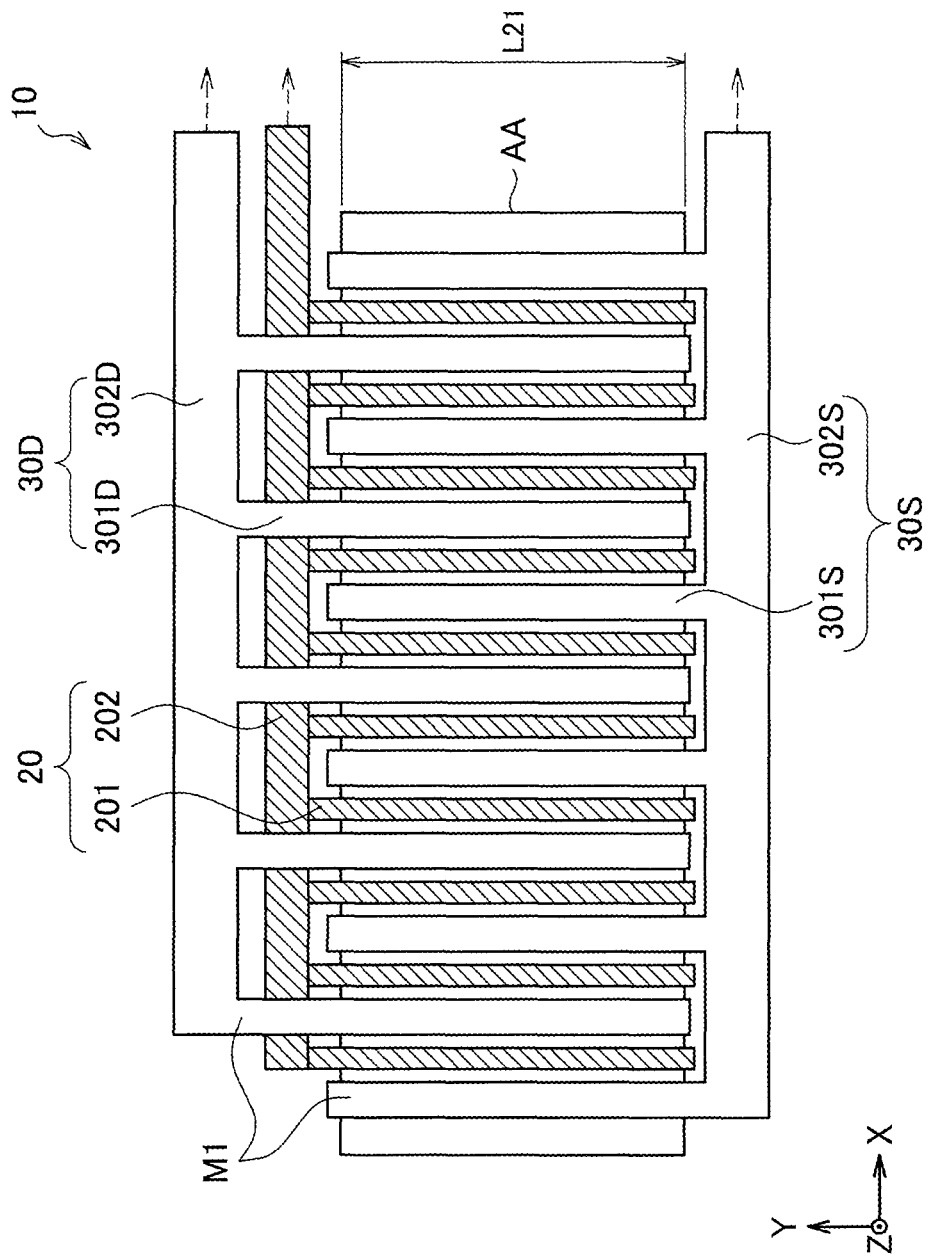
FIG. 8 is a plan view showing an overall configuration of a semiconductor device according to an embodiment of the present disclosure.

Next, the structure of a semiconductor device according to the present embodiment is described with reference to FIG. 8 and FIG. 9. FIG. 8 is a plan view showing the overall configuration of a semiconductor device according to the present embodiment.

As shown in FIG. 8, a semiconductor device 10 according to the present embodiment includes, for example, a field effect transistor for a radio frequency device that is included in the first or second switching element FET1 or FET2 in the SPST switch 1A. Further, the field effect transistor included in the semiconductor device 10 includes a gate electrode 20, a source electrode 30S, and a drain electrode 30D.

The gate electrode 20 includes a plurality of finger sections 201 extended in the same direction (for example, a Y direction) and a linking section 202 linking the plurality of finger sections 201, and has what is called a multi-finger structure. The gate width $W_g$ of the gate electrode 20 may be set as large as approximately several hundred micrometers to several millimeters for a field effect transistor used for a logic circuit or the like in order to reduce the loss of the field effect transistor, and the length (finger length) L21 of the finger section 201 may be several tens of micrometers. Further, the linking section 202 is connected to a gate contact (not illustrated).

Note that, in the following, a description is given by taking the direction in which the finger section 201 of the gate electrode 20 extends as a Y direction, the longitudinal direction of the linking section 202 as an X direction, and the direction (stacking direction) orthogonal to both directions as a Z direction.

The source electrode 30S includes, similarly to the gate electrode 20, a plurality of finger sections 301S extended in the same direction (for example, the Y direction) and a linking section 302S linking the plurality of finger sections 301S. Further, the linking section 302S is connected to a source contact (not illustrated).

The drain electrode 30D includes, similarly to the gate electrode 20, a plurality of finger sections 301D extended in the same direction (for example, the Y direction) and a linking section 302D linking the plurality of finger sections 301D. Further, the linking section 302D is connected to a drain contact (not illustrated).

Here, the finger section 201 of the gate electrode 20, the finger section 301S of the source electrode 30S, and the finger section 301D of the drain electrode 30D are arranged inside an active area AA. Further, the finger section 301S of the source electrode 30S and the finger section 301D of the drain electrode 30D are alternately arranged between finger sections 201 of the gate electrode 20. On the other hand, the linking section 202 of the gate electrode 20, the linking section 302S of the source electrode 30S, and the linking section 302D of the drain electrode 30D are arranged in an element isolation region outside the active area AA.

Figure 9:
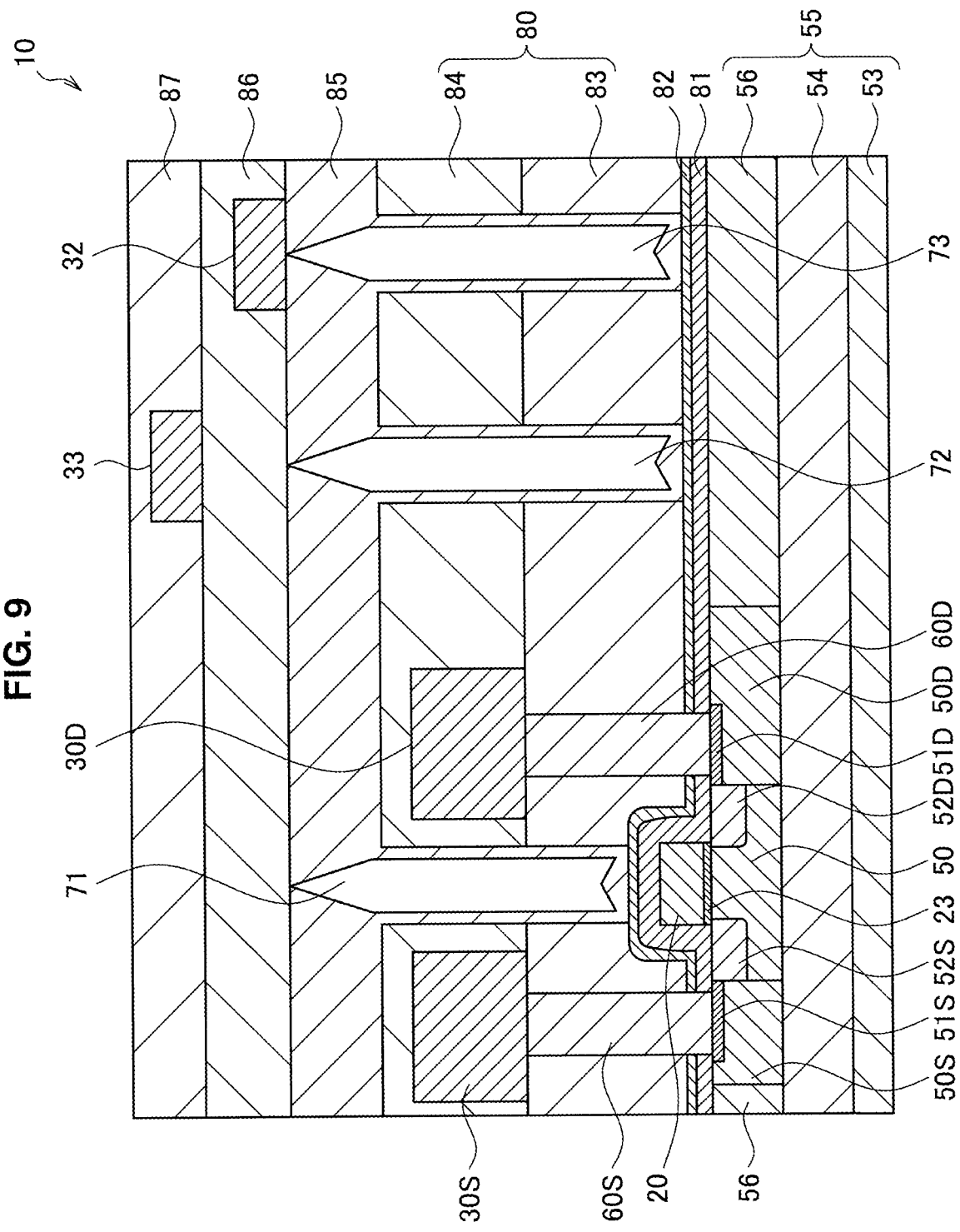
FIG. 9 is a cross-sectional view in a stacking direction showing a cross-sectional structure of the semiconductor device according to the embodiment.

FIG. 9 is a cross-sectional view in the stacking direction showing a cross-sectional structure of the semiconductor device according to the present embodiment. As shown in FIG. 9, the semiconductor device 10 according to the present embodiment includes, for example, a field effect transistor and a metal layer electrically connected to at least one of a gate electrode, a source electrode, and a drain electrode of the field effect transistor. Specifically, the semiconductor device 10 includes the gate electrode 20, a semiconductor layer 50, contact plugs 60S and 60D, the source electrode 30S, the drain electrode 30D, metal layers 32 and 33, and low-permittivity layers 71, 72 and 73.

The gate electrode 20 is provided on the semiconductor layer 50 via a gate oxide film 23. The gate electrode 20 has a thickness of, for example, 150 nm to 200 nm, and may contain polysilicon or the like. The gate oxide film 23 has a thickness of, for example, 5 nm to 10 nm, and may contain silicon oxide ($SiO_2$).

The semiconductor layer 50 may contain, for example, silicon (Si). A source region 50S and a drain region 50D containing n-type (n+) silicon are formed in the semiconductor layer 50 on both sides of the gate electrode 20.

Further, low-resistance regions 51S and 51D containing high-concentration n-type (n++) silicon or silicide are formed on the surfaces of the source region 50S and the drain region 50D in contact with the contact plugs 60S and 60D, for connection to the contact plugs 60S and 60D. Further, extension regions 52S and 52D containing low concentration n-type (n−) silicon are formed in the semiconductor layer 50 between the source region 50S and the gate electrode 20 and between the drain region 50D and the gate electrode 20.

Further, an element isolation layer 56 is formed in the semiconductor layer 50 outside the source region 50S and the drain region 50D. The element isolation layer 56 may contain, for example, silicon oxide ($SiO_2$) or the like.

The semiconductor layer 50 is formed on a support substrate 53 via an embedded oxide film 54, for example. The support substrate 53, the embedded oxide film 54, and the semiconductor layer 50 may form a silicon-on-insulator (SOI) substrate 55. The support substrate 53 may be, for example, a high-resistance silicon substrate, and the embedded oxide film 54 may contain, for example, $SiO_2$.

The contact plugs 60S and 60D are connected to the low-resistance regions 51S and 51D formed in the source region 50S and the drain region 50D. Each of the contact plugs 60S and 60D may have, for example, a stacked structure (not illustrated) of a titanium (Ti) layer, a titanium nitride (TiN) layer, and a tungsten (W) layer from the side of the low-resistance regions 51S and 51D. The titanium layer can reduce the contact resistance between the contact plugs 60S and 60D and the underlying low-resistance regions 51S and 51D, and the titanium nitride layer can suppress the diffusion of the tungsten layer provided on the upper side of the titanium nitride layer to the silicon.

The source electrode 30S and the drain electrode 30D are formed to be stacked on the contact plug 60S and the contact plug 60D. Note that the source electrode 30S and the drain electrode 30D may be referred to as a first metal M1. Each of the source electrode 30S and the drain electrode 30D (the first metal M1) has a thickness of, for example, 500 nm to 1000 nm, and may contain aluminum (Al).

A first insulating layer 81, a second insulating layer 82, a third insulating layer 83, a fourth insulating layer 84, a fifth insulating layer 85, a sixth insulating layer 86 and a seventh insulating layer 87 protect the respective configurations of the semiconductor device 10, and ensure insulation between ones of the configurations. The first insulating layer 81, the third insulating layer 83, the fourth insulating layer 84, the fifth insulating layer 85, the sixth insulating layer 86, and the seventh insulating layer 87 may contain, for example, $SiO_2$. Note that, in the following, the third insulating layer 83 and the fourth insulating layer 84 may be collectively referred to as an interlayer insulating layer 80.

Here, the second insulating layer 82 contains a material having a different etching rate from the third insulating layer 83 and the fourth insulating layer 84. This is in order to prevent etching from proceeding excessively when forming the low-permittivity layers 71, 72 and 73 described later. For example, in a case where the third insulating layer 83 and the fourth insulating layer 84 contain $SiO_2$, the second insulating layer 82 may contain silicon nitride ($Si_3N_4$ or the like).

Each of the low-permittivity layers 71, 72 and 73 is a layer having a lower permittivity than the third insulating layer 83, the fourth insulating layer 84, and the fifth insulating layer 85. Specifically, each of the low-permittivity layers 71, 72 and 73 may be a space. Further, each of the low-permittivity layers 71, 72 and 73 may be a layer containing a material having a lower permittivity than the third insulating layer 83, the fourth insulating layer 84, and the fifth insulating layer 85. The low-permittivity layer 71 is formed in a region between the source electrode 30S and the drain electrode 30D in the XY direction in the plane of the semiconductor layer 50. Further, the low-permittivity layers 72 and 73 are formed in regions below the metal layers 32 and 33, respectively, in the Z direction (stacking direction). Thereby, the semiconductor device 10 can reduce the nonlinear parasitic capacitance, and can therefore reduce the nonlinearity of the semiconductor device 10.

In a case where the third insulating layer 83, the fourth insulating layer 84, and the fifth insulating layer 85 contain $SiO_2$ (relative permittivity being 4.1), examples of the material that can form the low-permittivity layers 71, 72 and 73 include SiOC (relative permittivity being, for example, 2.5) in which Si—$CH_3$ is introduced in a $SiO_2$-based material, inorganic or organic spin-on-glass (SOG) (relative permittivity being, for example, less than or equal to 3), and the like.

Each of the metal layers 32 and 33 is, for example, at least one of an interconnection layer and a pad electrode electrically connected to the gate electrode 20, the source electrode 30S, or the drain electrode 30D of the field effect transistor. The metal layers 32 and 33 may be referred to as a second metal and a third metal from the bottom, depending on the positions where they are formed. In FIG. 9, the metal layer 32 corresponds to the second metal, and the metal layer 33 corresponds to the third metal. The metal layers 32 and 33 may contain, for example, aluminum (Al).

Note that, although in the above a case where the support substrate 53 of the SOI substrate 55 of the semiconductor device 10 is a high-resistance silicon substrate is described, the technology according to the present disclosure is not limited to the above. For example, in the semiconductor device 10, the support substrate 53 may be formed on a substrate containing sapphire (what is called a silicon-on-sapphire (SOS) substrate). Since a sapphire substrate has insulating properties, a field effect transistor formed on an SOS substrate can obtain characteristics close to those of a field effect transistor based on a compound such as GaAs. Further, the semiconductor device 10 according to the present embodiment may be formed on a bulk substrate other than an SOI substrate or an SOS substrate.

Figure 10:
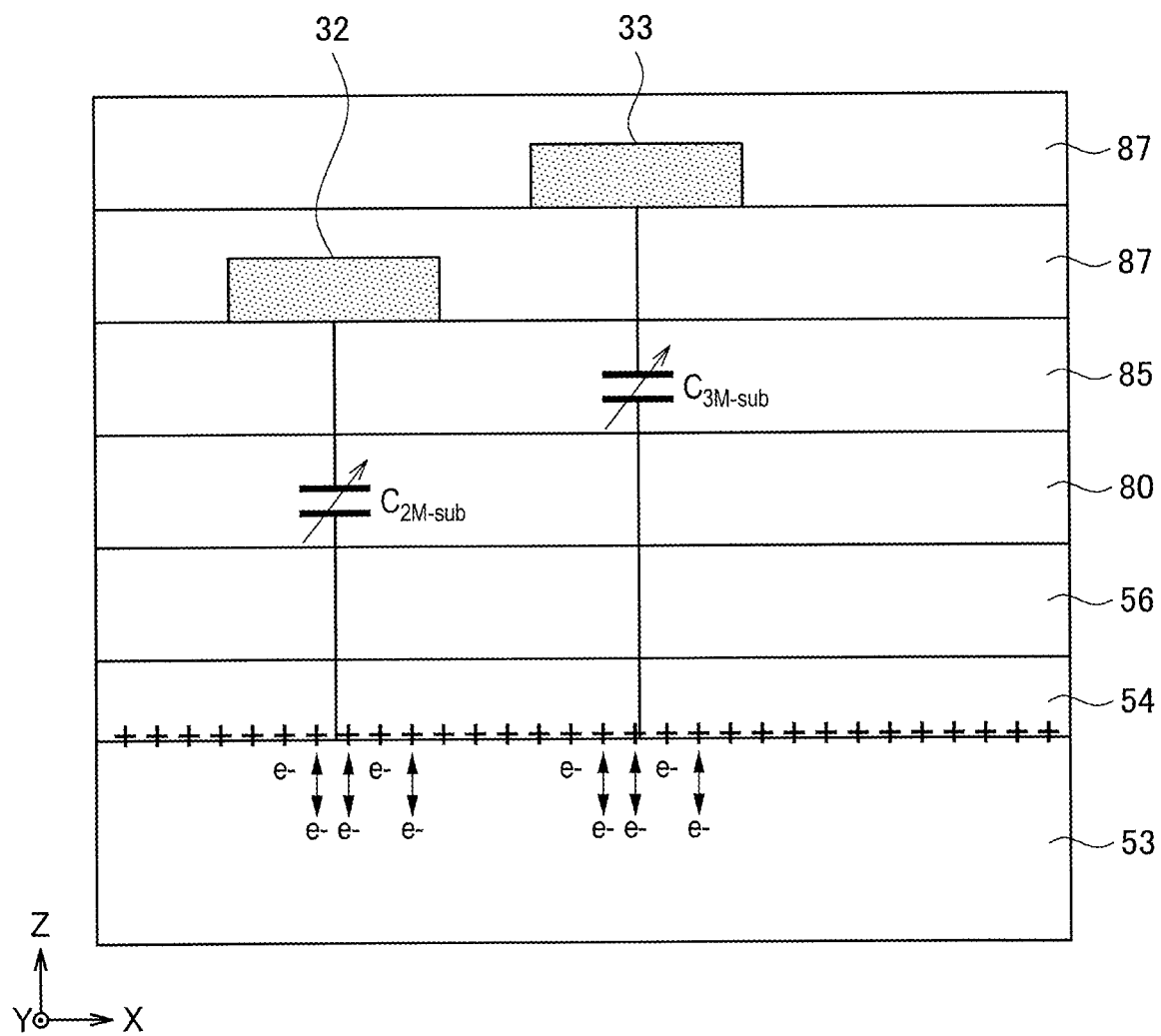
FIG. 10 is an explanatory diagram describing nonlinear capacitances in a semiconductor device.

The reduction in nonlinearity in the semiconductor device 10 described above will now be described with reference to FIG. 10. FIG. 10 is an explanatory diagram describing nonlinear capacitances in the semiconductor device 10.

As shown in FIG. 10, in the semiconductor device 10, the interface between the support substrate 53 and the embedded oxide film 54 included in the SOI substrate 55 is charged positive due to defects of the embedded oxide film 54. Hence, electrons in the support substrate 53 are attracted to the interface between the support substrate 53 and the embedded oxide film 54, and some electrons are captured in defects of the embedded oxide film 54.

Here, in a case where an RF signal has passed through each of the metal layers 32 and 33 located on the upper side of the SOI substrate 55, defects of the embedded oxide film 54 repeat the capture and release of captured electrons. In this event, the parasitic capacitances between the support substrate 53 and the metal layers 32 and 33 fluctuate, and therefore nonlinearity occurs in capacitance.

A possible measure to reduce such nonlinearity is to reduce the parasitic capacitances between the support substrate 53 and the metal layers 32 and 33 and thus reduce the absolute values of the nonlinear capacitances. In the semiconductor device 10 according to the present embodiment, parts of the insulating layers located between the support substrate 53 and the metal layers 32 and 33 (that is, the interlayer insulating layer 80 and the fifth insulating layer 85) are replaced with the low-permittivity layers 72 and 73 having a lower permittivity; thereby, the absolute values of the parasitic capacitances between the support substrate 53 and the metal layers 32 and 33 are reduced, and nonlinearity is reduced.

In the following, specific arrangements of low-permittivity layers 72 and 73 in the semiconductor device 10 according to the present embodiment are described with reference to FIG. 11 to FIG. 18, with an individual description for a first to a sixth structural example.

(1.1. First Structural Example)

Figure 11:
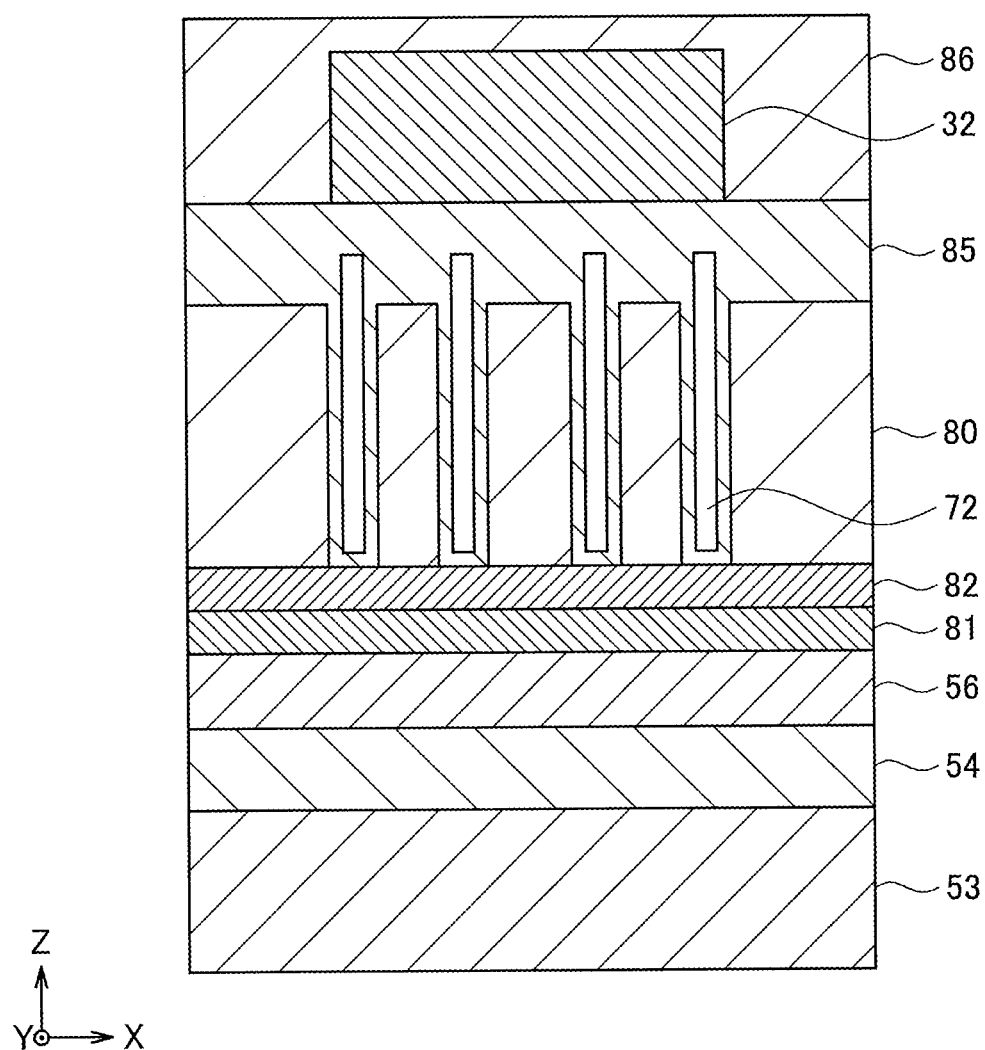
FIG. 11 is a cross-sectional view in a stacking direction of a semiconductor device according to a first structural example.

First, a first structural example of the semiconductor device 10 according to the present embodiment is described with reference to FIG. 11 to FIG. 12B. FIG. 11 is a cross-sectional view in the stacking direction of the semiconductor device 10 according to the first structural example, and FIG. 12A and FIG. 12B are plan views showing examples of planar arrangement of low-permittivity layers of the first structural example.

As shown in FIG. 11, a plurality of low-permittivity layers 72 may be formed below the metal layer 32. For example, in a case where one low-permittivity layer 72 is formed in the entire projection region of the metal layer 32 when a planar view of the support substrate 53 is viewed, the strength of the semiconductor device 10 may be reduced. In particular, in a case where the low-permittivity layer 72 is a space, it is highly likely that the strength of the semiconductor device 10 is reduced. Hence, by forming a plurality of low-permittivity layers 72 separately below the metal layer 32, the metal layer 32 can be supported by the interlayer insulating layer 80 between adjacent ones of the low-permittivity layers 72. Thereby, the capacitance between the metal layer 32 and the support substrate 53 can be reduced while the strength of the semiconductor device 10 is maintained.

Figure 12A:
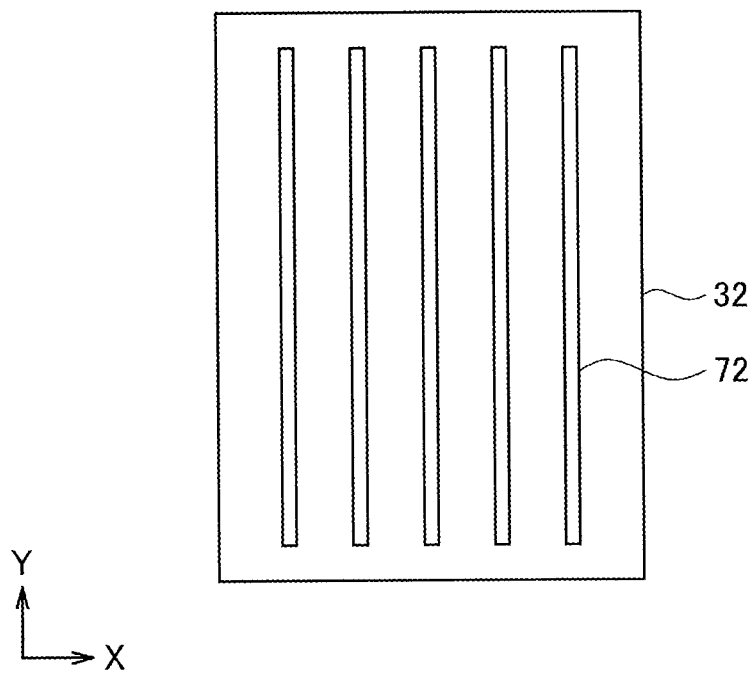
FIG. 12A is a plan view showing an example of planar arrangement of low-permittivity layers of the first structural example.

Here, as shown in FIG. 12A, the planar arrangement of low-permittivity layers 72 may be in a striped fashion. Note that the direction in which the low-permittivity layer 72 extends may be a direction parallel to the interconnection direction of the metal layer 32, or may be a direction perpendicular to the interconnection direction of the metal layer 32. However, to improve the strength of the semiconductor device 10, the length with which the low-permittivity layer 72 is extended is preferably shorter. Hence, the direction in which the low-permittivity layer 72 extends is preferably a direction perpendicular to the interconnection direction of the metal layer 32.

Figure 12B:
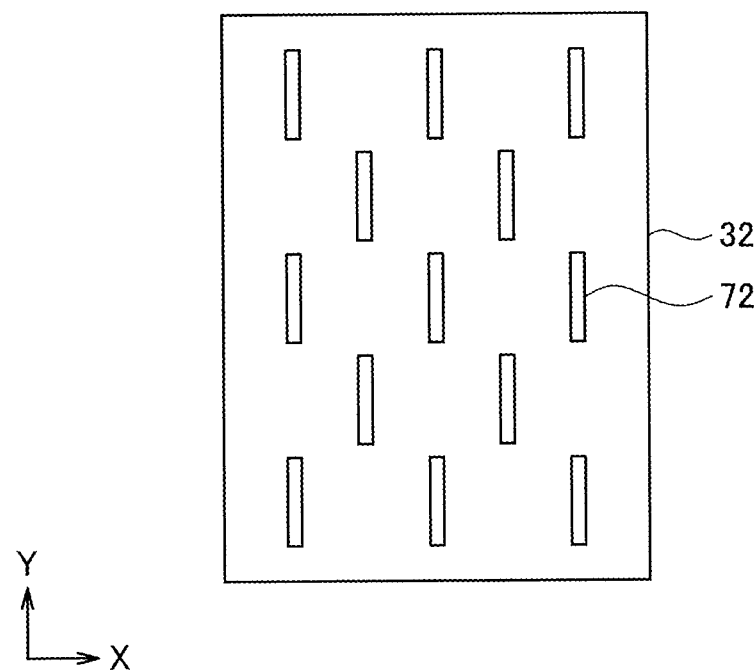
FIG. 12B is a plan view showing an example of planar arrangement of low-permittivity layers of the first structural example.

Further, as shown in FIG. 12B, the planar arrangement of low-permittivity layers 72 may be in a zigzag fashion. In such a case, the length with which the low-permittivity layer 72 is extended is shortened, and low-permittivity layers 72 are arranged scatteredly over the entire metal layer 32; thus, the strength of the semiconductor device 10 can be improved while the volume of formed low-permittivity layers 72 is maintained. Further, by shortening the length with which the low-permittivity layer 72 is extended, electric fields can be prevented from going around the low-permittivity layer 72.

(1.2. Second Structural Example)

Figure 13:
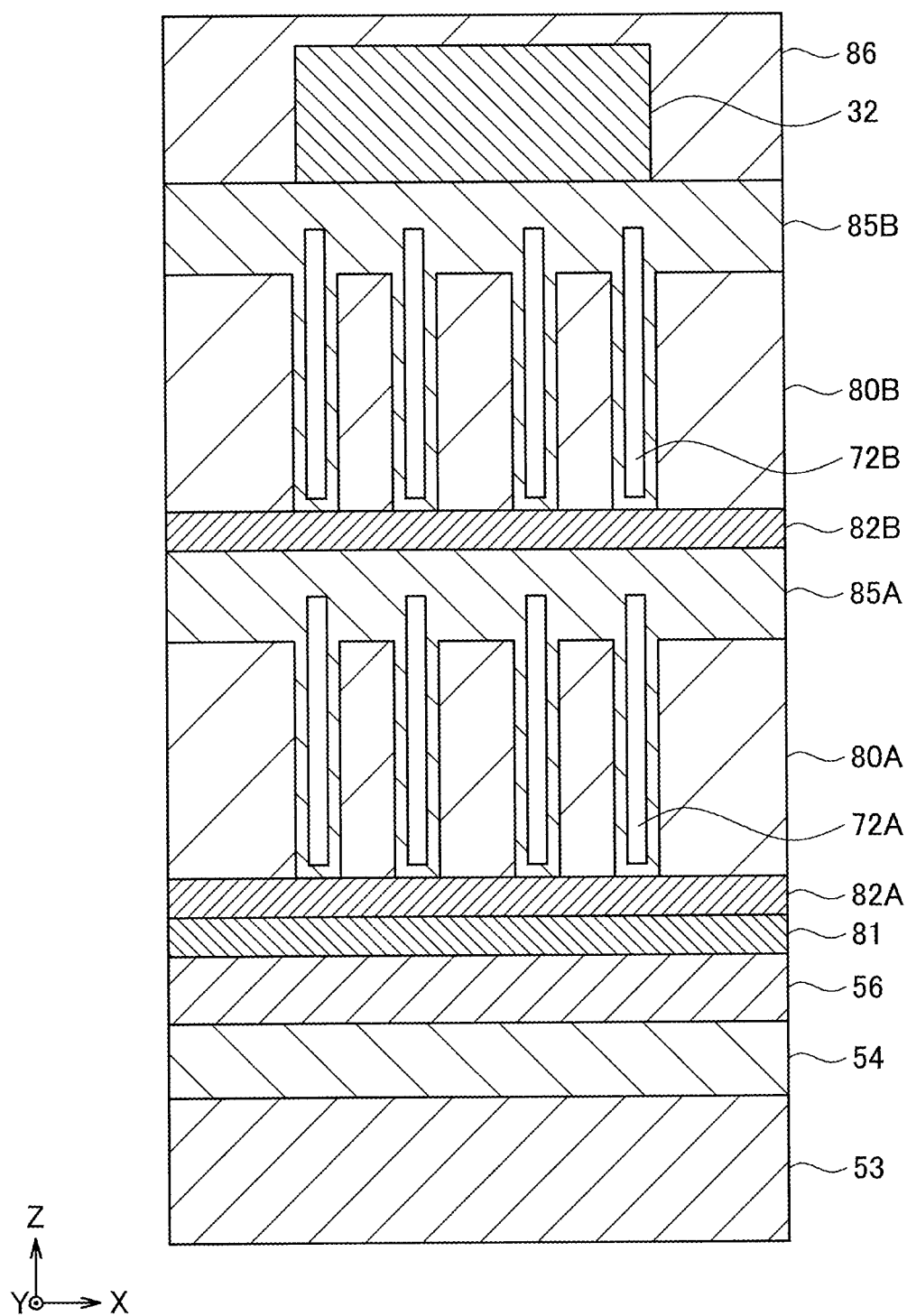
FIG. 13 is a cross-sectional view in a stacking direction of a semiconductor device 10 according to a second structural example.

Next, a second structural example of the semiconductor device 10 according to the present embodiment is described with reference to FIG. 13 to FIG. 14B. FIG. 13 is a cross-sectional view in the stacking direction of the semiconductor device 10 according to the second structural example, and FIG. 14A and FIG. 14B are plan views showing examples of arrangement of low-permittivity layers of the second structural example.

As shown in FIG. 13, a plurality of low-permittivity layers 72A and 72B may be formed separately. Specifically, the first insulating layer 81, a second insulating layer 82A, an interlayer insulating layer 80A, and a fifth insulating layer 85A are formed on the element isolation layer 56, and the low-permittivity layers 72A are formed in the interlayer insulating layer 80A and the fifth insulating layer 85A. Further, a second insulating layer 82B, an interlayer insulating layer 80B, and a fifth insulating layer 85B are formed on the fifth insulating layer 85A, and the low-permittivity layers 72B are formed in the interlayer insulating layer 80B and the fifth insulating layer 85B. Further, the metal layer 32 is formed on the fifth insulating layer 85B.

Thereby, the distance between the metal layer 32 and the support substrate 53 can be elongated, and therefore the parasitic capacitance between the metal layer 32 and the support substrate 53 can be further reduced. Further, in such a case, it is preferable that the low-permittivity layer 72A and the low-permittivity layer 72B be arranged such that the positions of them when a planar view of the support substrate 53 is viewed do not overlap. This is because the strength of the semiconductor device 10 may be reduced locally in a place where the low-permittivity layer 72A and the low-permittivity layer 72B overlap.

Figure 14A:
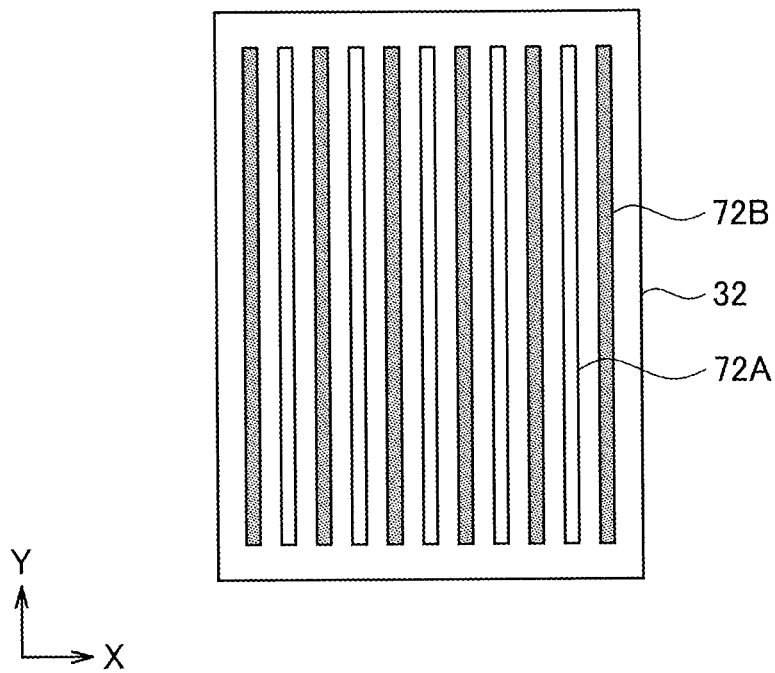
FIG. 14A is a plan view showing an example of arrangement of low-permittivity layers of the second structural example.
Figure 14B:
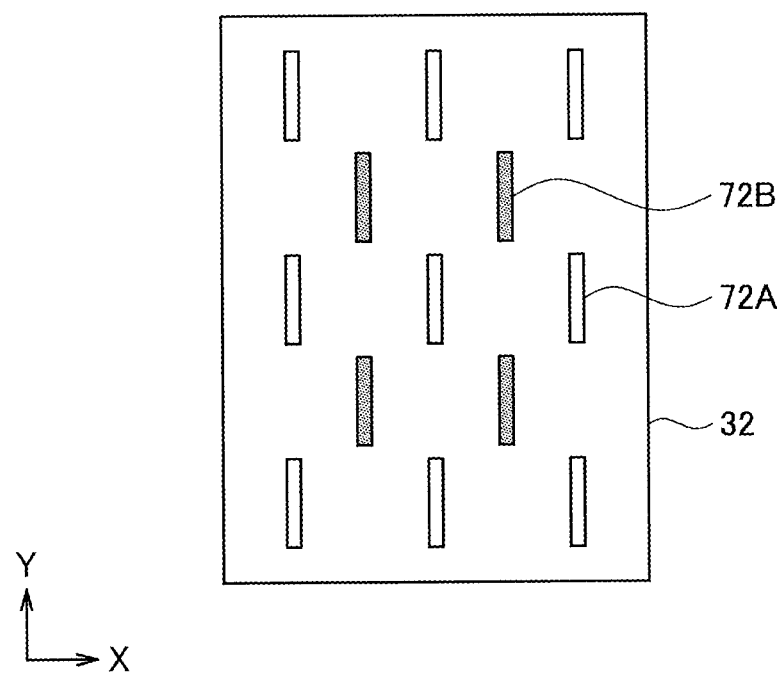
FIG. 14B is a plan view showing an example of arrangement of low-permittivity layers of the second structural example.

Here, as shown in FIG. 14A, the planar arrangement of low-permittivity layers 72A and 72B may be in a striped fashion. As described above, the direction in which the low-permittivity layers 72A and 72B extend may be a direction parallel to the interconnection direction of the metal layer 32, or may be a direction perpendicular to the interconnection direction of the metal layer 32. However, to improve the strength of the semiconductor device 10, the direction in which the low-permittivity layers 72A and 72B extend is preferably a direction perpendicular to the interconnection direction of the metal layer 32. Further, it is preferable that, when a planar view of the support substrate 53 is viewed, the low-permittivity layers 72A and 72B be arranged such that a low-permittivity layer 72B is located between low-permittivity layers 72A.

Further, as shown in FIG. 14B, the planar arrangement of low-permittivity layers 72A and 72B may be in a zigzag fashion. In such a case, the length with which the low-permittivity layers 72A and 72B are extended is shortened, and low-permittivity layers 72 are arranged scatteredly over the entire metal layer 32; thus, the strength of the semiconductor device 10 can be improved while the volume of formed low-permittivity layers 72A and 72B is maintained. Further, in a case where the length with which the low-permittivity layers 72A and 72B are extended is short, electric fields can be prevented from going around the low-permittivity layer 72. Further, it is preferable that each of the low-permittivity layers 72A and 72B be arranged at the same interval. In such a case, the formation of the low-permittivity layers 72A and 72B can be performed easily.

(1.3. Third Structural Example)

Figure 15:
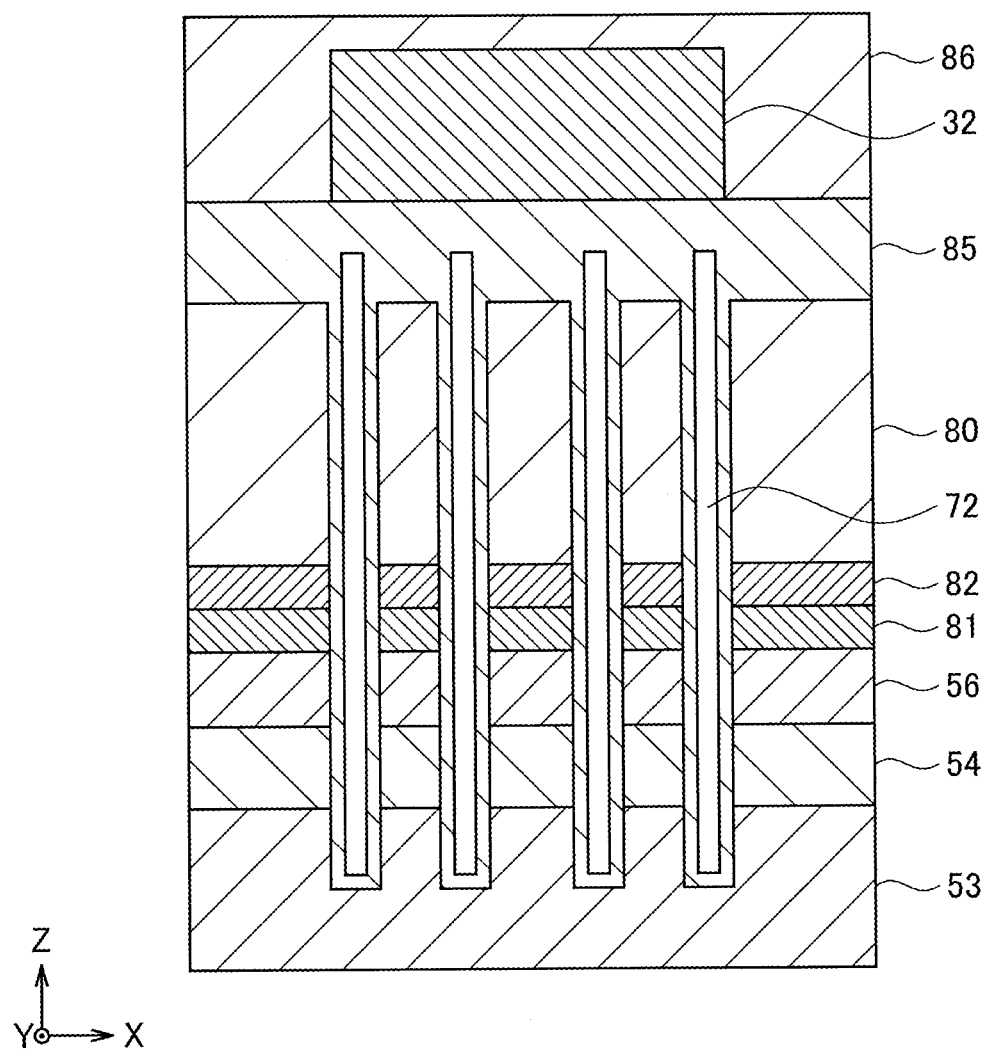
FIG. 15 is a cross-sectional view in a stacking direction of a semiconductor device according to a third structural example.

Next, a third structural example of the semiconductor device 10 according to the present embodiment is described with reference to FIG. 15. FIG. 15 is a cross-sectional view in the stacking direction of the semiconductor device 10 according to the third structural example.

As shown in FIG. 15, the low-permittivity layer 72 may be formed to pierce up to the support substrate 53. Specifically, the low-permittivity layer 72 is formed to pierce the fifth insulating layer 85, the interlayer insulating layer 80, the second insulating layer 82, the first insulating layer 81, the element isolation layer 56, and the embedded oxide film 54, and reach the support substrate 53.

In such a case, the volume of the low-permittivity layer 72 can be increased, and therefore the mean permittivity between the metal layer 32 and the support substrate 53 can be reduced; thereby, the parasitic capacitance between the metal layer 32 and the support substrate 53 can be further reduced. Further, the area of the interface between the support substrate 53 and the embedded oxide film 54 can be reduced, and therefore the amount of positive charge carried in the embedded oxide film 54 can be reduced.

Note that, in the third structural example, the planar arrangement of low-permittivity layers 72 may be any arrangement, and may be in the striped fashion or the zigzag fashion shown in the first structural example.

(1.4. Fourth Structural Example)

Figure 16:
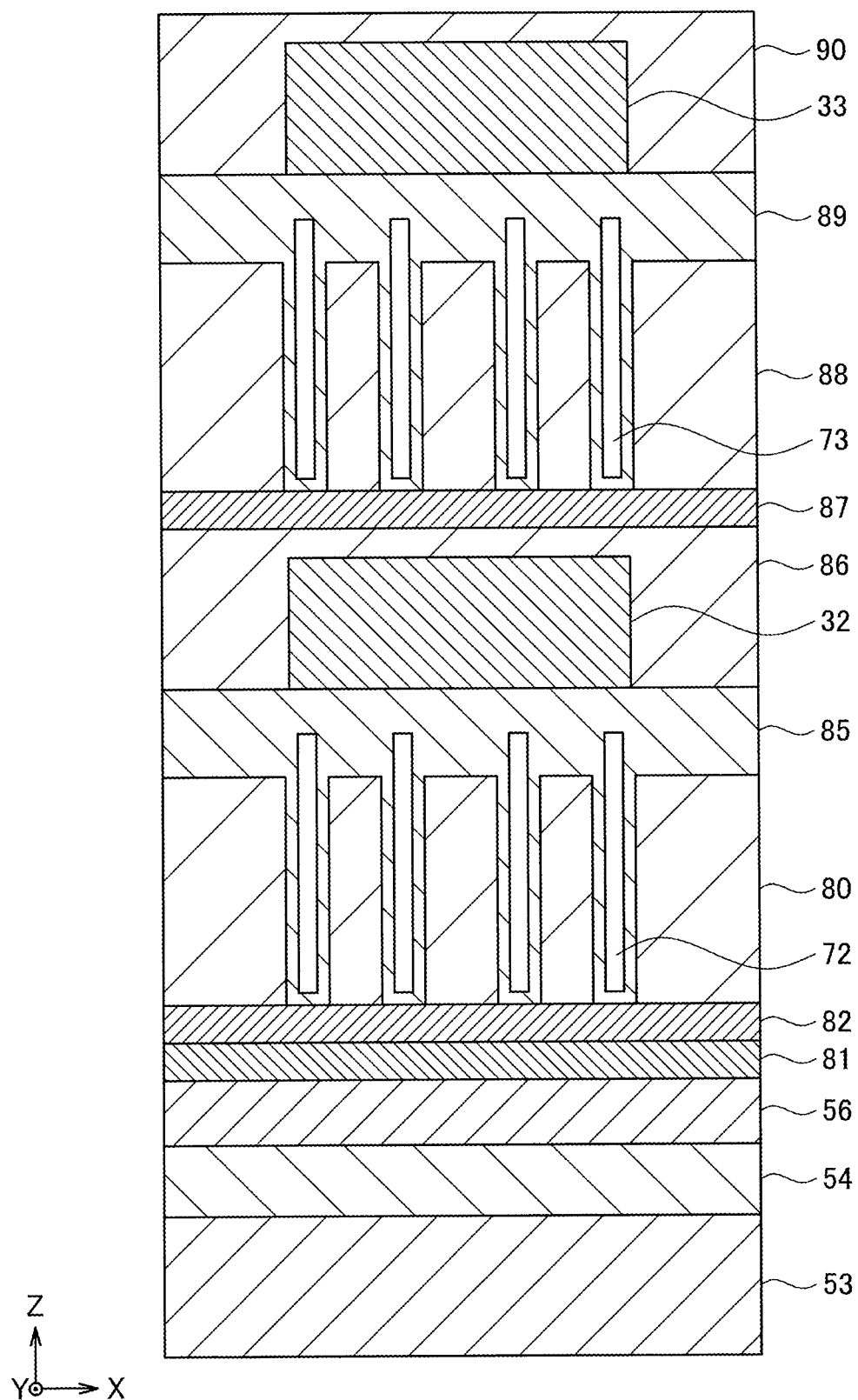
FIG. 16 is a cross-sectional view in a stacking direction of a semiconductor device according to a fourth structural example.

Next, a fourth structural example of the semiconductor device 10 according to the present embodiment is described with reference to FIG. 16. FIG. 16 is a cross-sectional view in the stacking direction of the semiconductor device 10 according to the fourth structural example.

As shown in FIG. 16, in the semiconductor device 10, the low-permittivity layer 73 may be formed further between the metal layer 33 and the metal layer 32. Specifically, on the metal layer 32 (corresponding to the second metal), the seventh insulating layer 87 is formed using a material (silicon nitride or the like) similar to the material of the second insulating layer 82. Further, an eighth insulating layer 88 and a ninth insulating layer 89 are formed using silicon oxide or the like on the seventh insulating layer 87, and the low-permittivity layer 73 is formed in the eighth insulating layer 88 and the ninth insulating layer 89. Further, the metal layer 33 (corresponding to the third metal) is formed on the ninth insulating layer 89, and the metal layer 33 is embedded in a tenth insulating layer 90 containing silicon oxide or the like.

In such a case, by reducing the mean permittivity between the metal layer 32 and the metal layer 33, the low-permittivity layer 73 can reduce the parasitic capacitance between the metal layer 32 and the metal layer 33. The parasitic capacitance between the metal layer 32 and the metal layer 33 does not have nonlinearity, but causes loss to a signal that passes through the metal layer 32 or the metal layer 33. Thus, the loss of the semiconductor device 10 can be reduced more by reducing the parasitic capacitance between the metal layer 32 and the metal layer 33.

(1.5. Fifth Structural Example)

Figure 17:
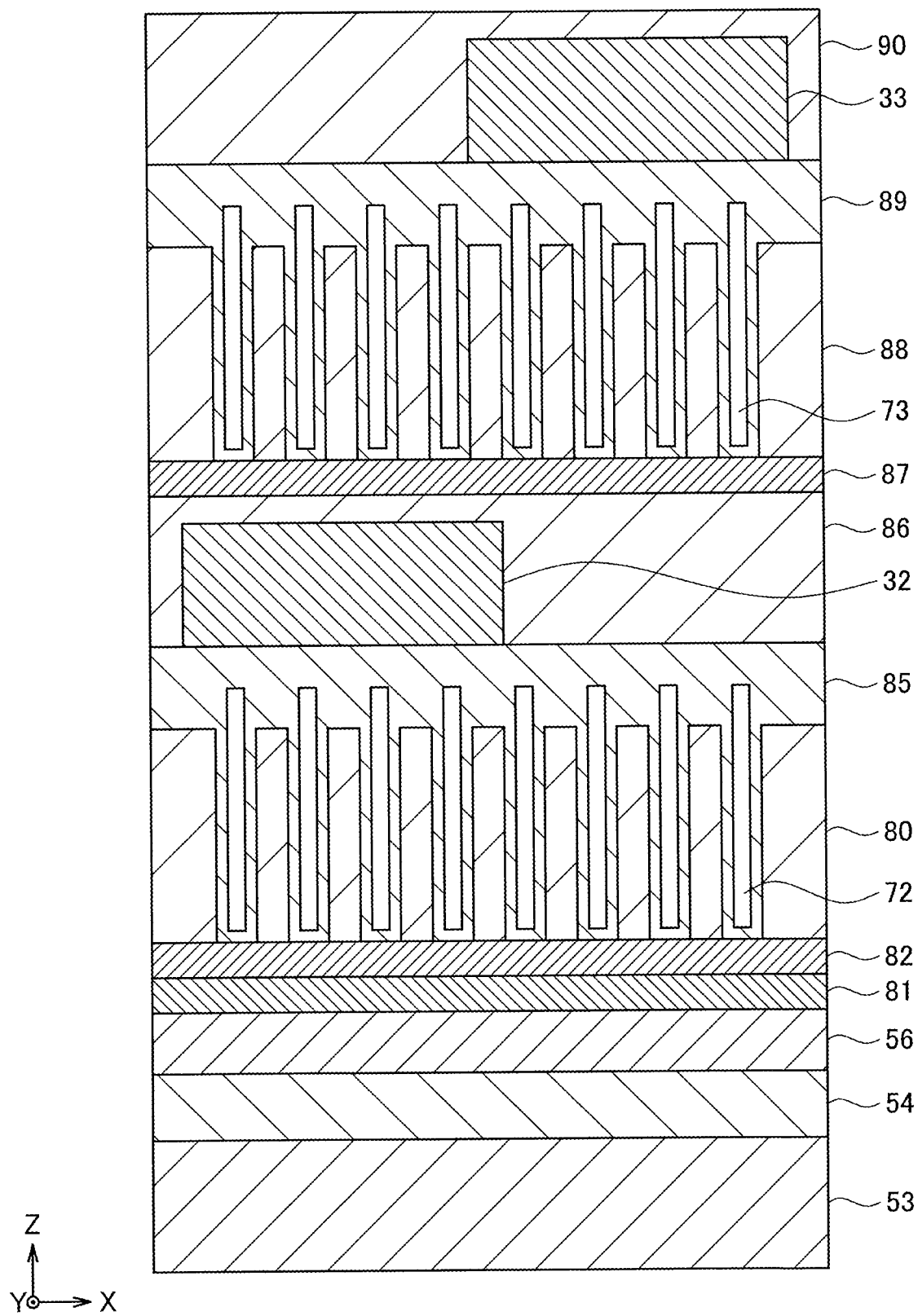
FIG. 17 is a cross-sectional view in a stacking direction of a semiconductor device according to a fifth structural example.

Next, a fifth structural example of the semiconductor device 10 according to the present embodiment is described with reference to FIG. 17. FIG. 17 is a cross-sectional view in the stacking direction of the semiconductor device 10 according to the fifth structural example.

As shown in FIG. 17, the low-permittivity layers 72 and 73 are formed at least in the projection regions of the metal layers 32 and 33 when a planar view of the support substrate 53 is viewed. Further, the low-permittivity layer 72 may be formed in the neighboring interlayer insulating layer 80 including immediately below the metal layer 32, and the low-permittivity layer 73 may be formed in the neighboring eighth insulating layer 88 including immediately below the metal layer 33.

This is because the parasitic capacitance between the metal layer 32 and the support substrate 53 is influenced not only by the interlayer insulating layer 80 of the region immediately below the metal layer 32 (that is, the projection region of the metal layer 33 when a planar view of the support substrate 53 is viewed) but also by the permittivity of the neighboring interlayer insulating layer 80. Further, this is because a parasitic capacitance between the metal layer 32 and the metal layer 33 is generated also in a case where the metal layer 32 exists in a region near the region immediately below the metal layer 33.

In a case where the low-permittivity layer 72 is formed in the neighboring interlayer insulating layer 80 including immediately below the metal layer 32, the parasitic capacitance having nonlinearity between the metal layer 32 and the support substrate 53 can be reduced. Further, in a case where the low-permittivity layer 73 is formed in the neighboring eighth insulating layer 88 including immediately below the metal layer 33, the parasitic capacitance between the metal layer 32 and the metal layer 33 can be reduced. Note that, in the fifth structural example, the planar arrangement of low-permittivity layers 72 and 73 may be any arrangement, and may be in the striped fashion or the zigzag fashion shown in the second structural example.

(1.6. Sixth Structural Example)

Figure 18:
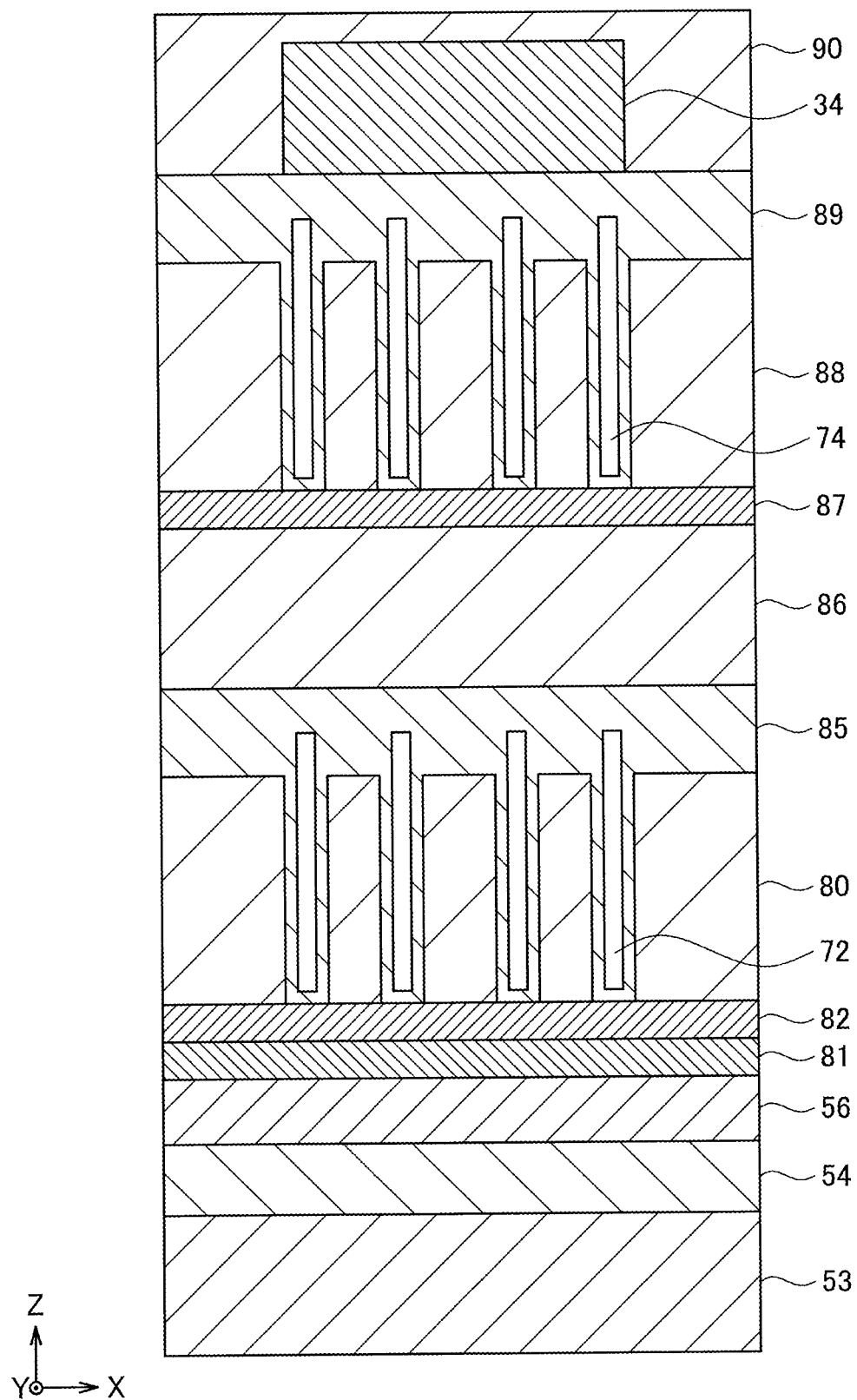
FIG. 18 is a cross-sectional view in a stacking direction of a semiconductor device according to a sixth structural example.

Next, a sixth structural example of the semiconductor device 10 according to the present embodiment is described with reference to FIG. 18. FIG. 18 is a cross-sectional view in the stacking direction of the semiconductor device 10 according to the sixth structural example.

As shown in FIG. 18, low-permittivity layers 72 and 74 may be formed between a metal layer 34 that is a pad electrode and the support substrate 53. Specifically, the low-permittivity layer 72 is formed in the interlayer insulating layer 80 on the second insulating layer 82 and in the fifth insulating layer 85. Further, the low-permittivity layer 74 is formed in the eighth insulating layer 88 on the seventh insulating layer 87 and in the ninth insulating layer 89. Further, the metal layer 34 that is a pad electrode is formed on the ninth insulating layer 89, and the metal layer 34 is embedded in the tenth insulating layer 90.

In such a case, the low-permittivity layers 72 and 74 can reduce the parasitic capacitance having nonlinearity between the metal layer 34 that is a pad electrode and the support substrate 53. Thereby, the nonlinear capacitance of the semiconductor device 10 can be reduced. Note that, in the sixth structural example, the planar arrangement of low-permittivity layers 72 and 74 may be any arrangement, and may be in the striped fashion or the zigzag fashion shown in the third structural example.

2. Method for Manufacturing Semiconductor Device

Next, a method for manufacturing the semiconductor device 10 according to the present embodiment is described with reference to FIG. 19 to FIG. 30. FIG. 19 to FIG. 30 are cross-sectional views in the stacking direction showing the manufacturing process of the semiconductor device 10 according to the present embodiment.

Figure 19:
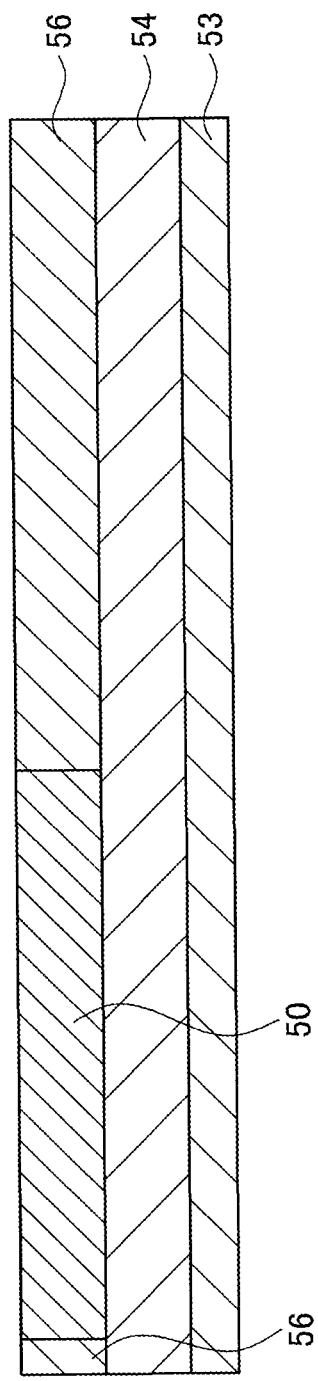
FIG. 19 is a cross-sectional view in a stacking direction showing a manufacturing process of a semiconductor device according to the embodiment.

First, as shown in FIG. 19, the SOI substrate 55 in which the embedded oxide film 54 and the semiconductor layer 50 are formed on the support substrate 53 is prepared. In the semiconductor layer 50 of the SOI substrate 55, for example, the element isolation layer 56 is formed by the STI method or the LOCOS method, and a transistor region separated by the element isolation layer 56 is formed.

Next, for example, an implantation through film (not illustrated) of a silicon oxide film is formed by the thermal oxidation method or the like, and well implantation and channel implantation are performed on the transistor region where the silicon oxide film is formed. Note that the implantation through film is removed after the well implantation and the channel implantation are performed.

Figure 20:
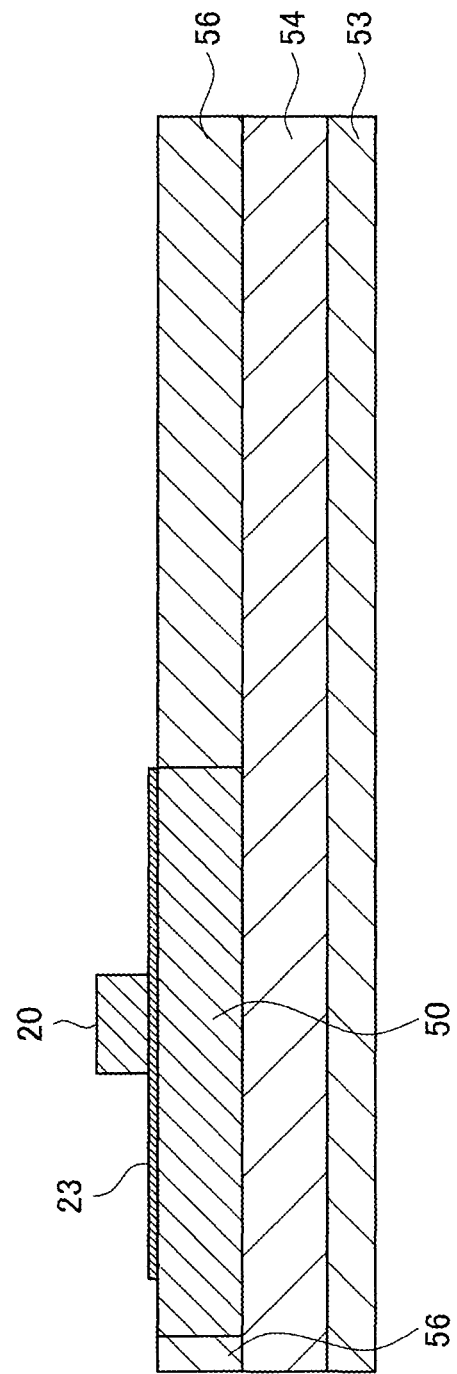
FIG. 20 is a cross-sectional view in a stacking direction showing a manufacturing process of a semiconductor device according to the embodiment.

Subsequently as shown in FIG. 20, the gate oxide film 23 containing silicon oxide is formed with a thickness of, for example, 5 nm to 10 nm by the thermal oxidation method or the like. After that, a gate electrode material film (not illustrated) containing polysilicon is formed with a thickness of, for example, 150 nm to 200 nm by the chemical vapor deposition (CVD) method or the like. Further, the gate electrode material film is processed by photolithography and etching, and thereby the gate electrode 20 is formed on the semiconductor layer 50 via the gate oxide film 23.

Figure 21:
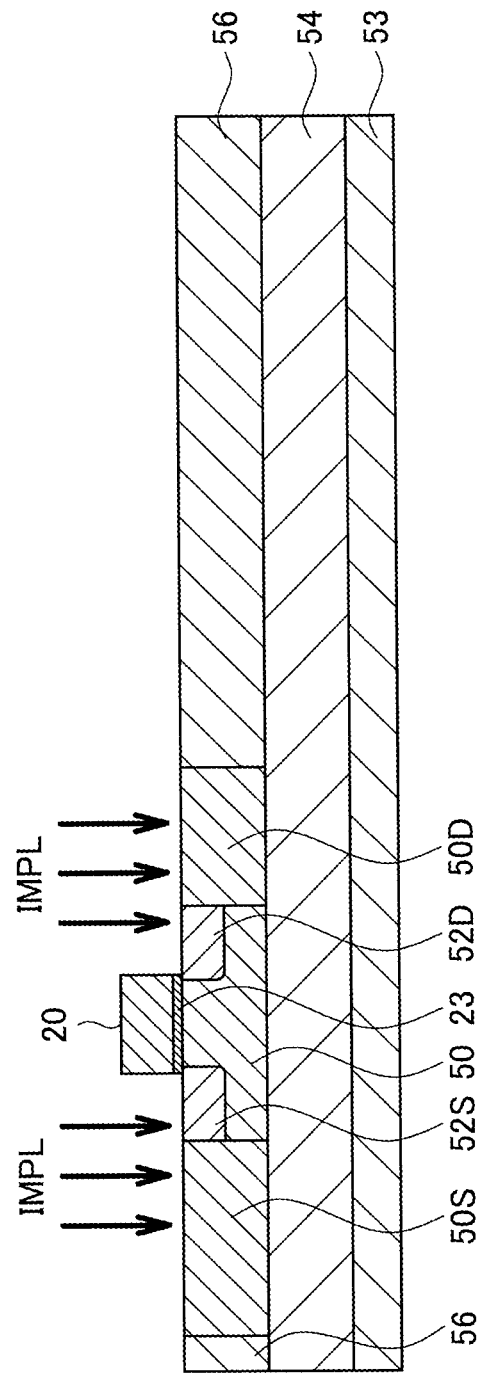
FIG. 21 is a cross-sectional view in a stacking direction showing a manufacturing process of a semiconductor device according to the embodiment.

Next, as shown in FIG. 21, using the gate electrode 20 and an offset spacer (not illustrated) as a mask, implantation IMPL of arsenic (As) or phosphorus (P) is performed, and the extension regions 52S and 52D are formed on both sides of the gate electrode 20. Further, a side wall (not illustrated) is formed on the side surface of the gate electrode 20, and then implantation of arsenic (As) or phosphorus (P) is performed. Thereby, the source region 50S and the drain region 50D are formed in the semiconductor layer 50 on both sides of the gate electrode 20. The side wall is removed after the source region 50S and the drain region 50D are formed.

Figure 22:
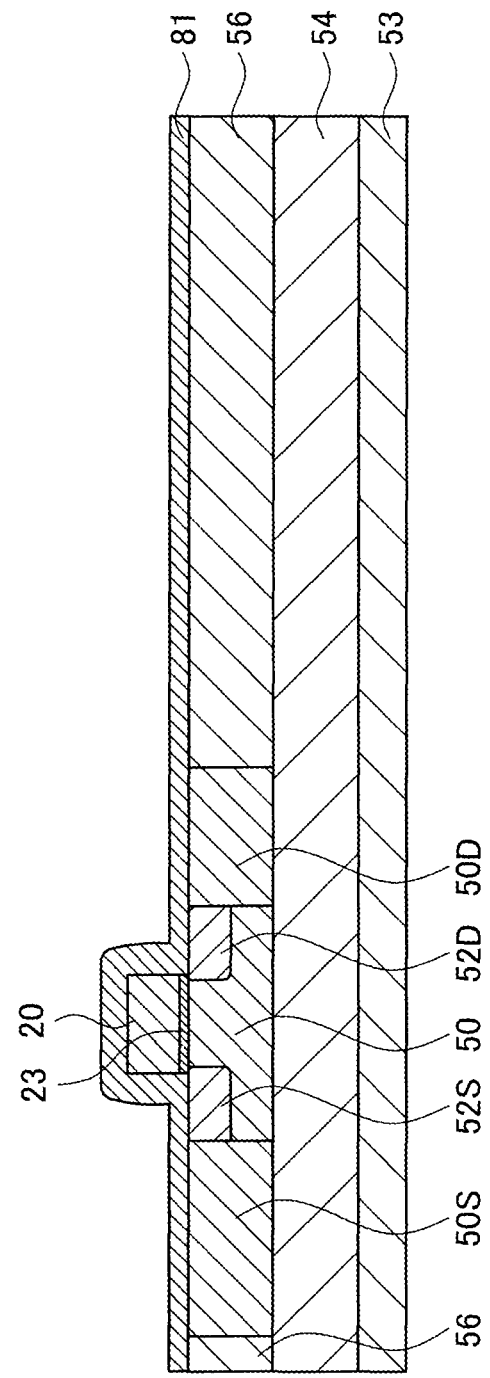
FIG. 22 is a cross-sectional view in a stacking direction showing a manufacturing process of a semiconductor device according to the embodiment.

Subsequently, as shown in FIG. 22, after the source region 50S and the drain region 50D are formed, the first insulating layer 81 containing silicon oxide is formed with a thickness of, for example, 10 nm to 30 nm on the gate electrode 20 and the semiconductor layer 50 by the CVD method or the like.

Figure 23:
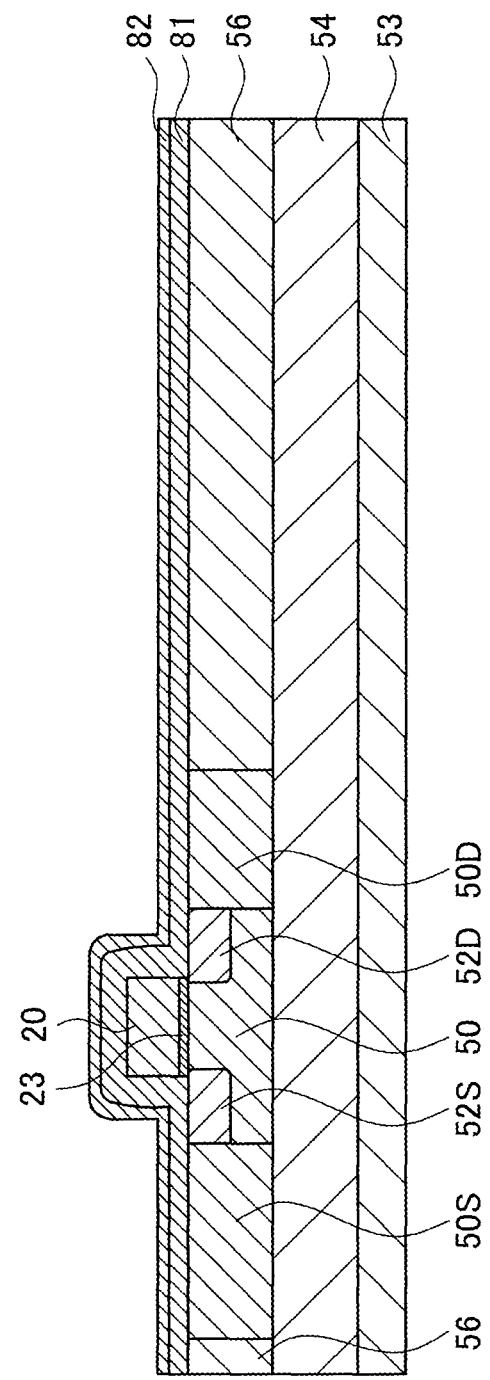
FIG. 23 is a cross-sectional view in a stacking direction showing a manufacturing process of a semiconductor device according to the embodiment.

Next, as shown in FIG. 23, the second insulating layer 82 containing silicon nitride ($Si_3N_4$ or the like) is formed with a thickness of, for example, 5 nm to 30 nm on the first insulating layer 81 by the CVD method or the like. Note that silicon nitride has a different etching rate from silicon oxide, and can therefore prevent etching from proceeding excessively during the etching of the third insulating layer 83 and the fourth insulating layer 84 described later.

Figure 24:
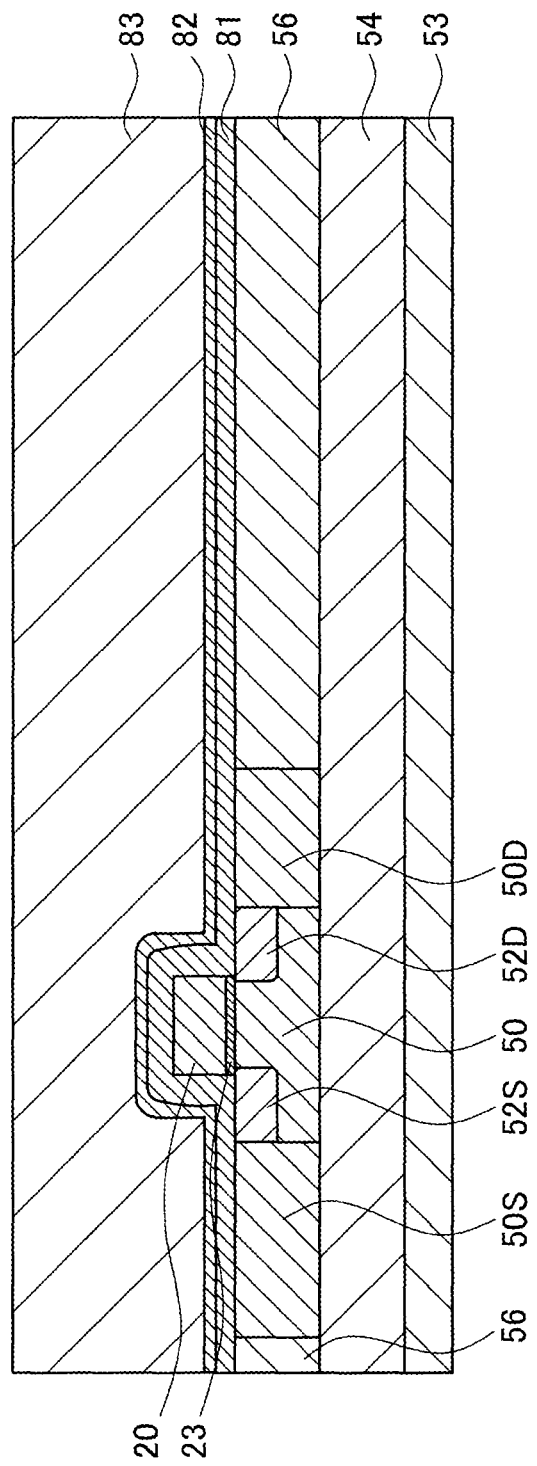
FIG. 24 is a cross-sectional view in a stacking direction showing a manufacturing process of a semiconductor device according to the embodiment.

Subsequently, as shown in FIG. 24, the third insulating layer 83 containing silicon oxide is formed with a thickness of, for example, 500 nm to 1000 nm on the second insulating layer 82 by the CVD method or the like.

Figure 25:
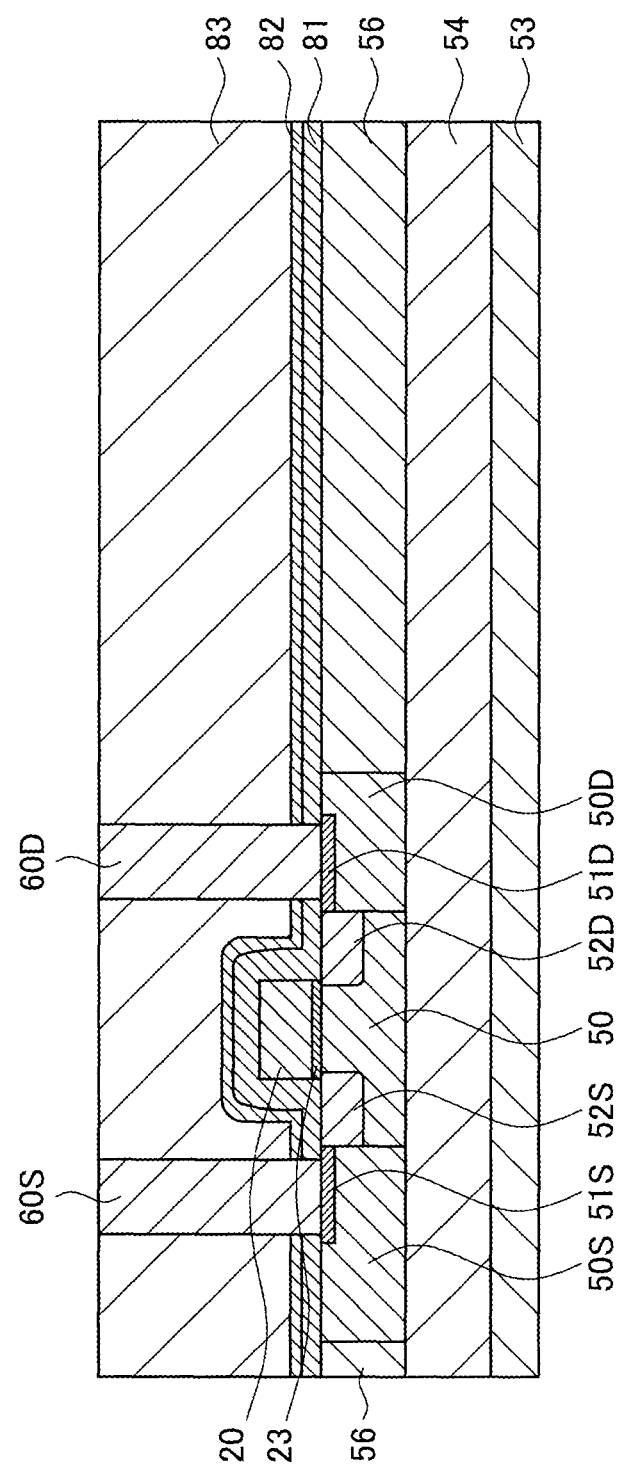
FIG. 25 is a cross-sectional view in a stacking direction showing a manufacturing process of a semiconductor device according to the embodiment.

Next, as shown in FIG. 25, after the third insulating layer 83 is formed, parts of the third insulating layer 83, the second insulating layer 82, and the first insulating layer 81 are removed by photolithography and etching, and a contact hole (not illustrated) is formed on each of the source region 50S and the drain region 50D. After the contact holes are formed, implantation IMPL with high concentration arsenic (As) or phosphorus (P) is performed via the contact holes, and thereby the low-resistance regions 51S and 51D are formed.

After the low-resistance regions 51S and 51D are formed, the contact plugs 60S and 60D each having a stacked structure of a titanium layer, a titanium nitride layer, and a tungsten layer are formed in the contact holes. Note that the contact plugs 60S and 60D are formed on the source region 50S and the drain region 50D.

Figure 26:
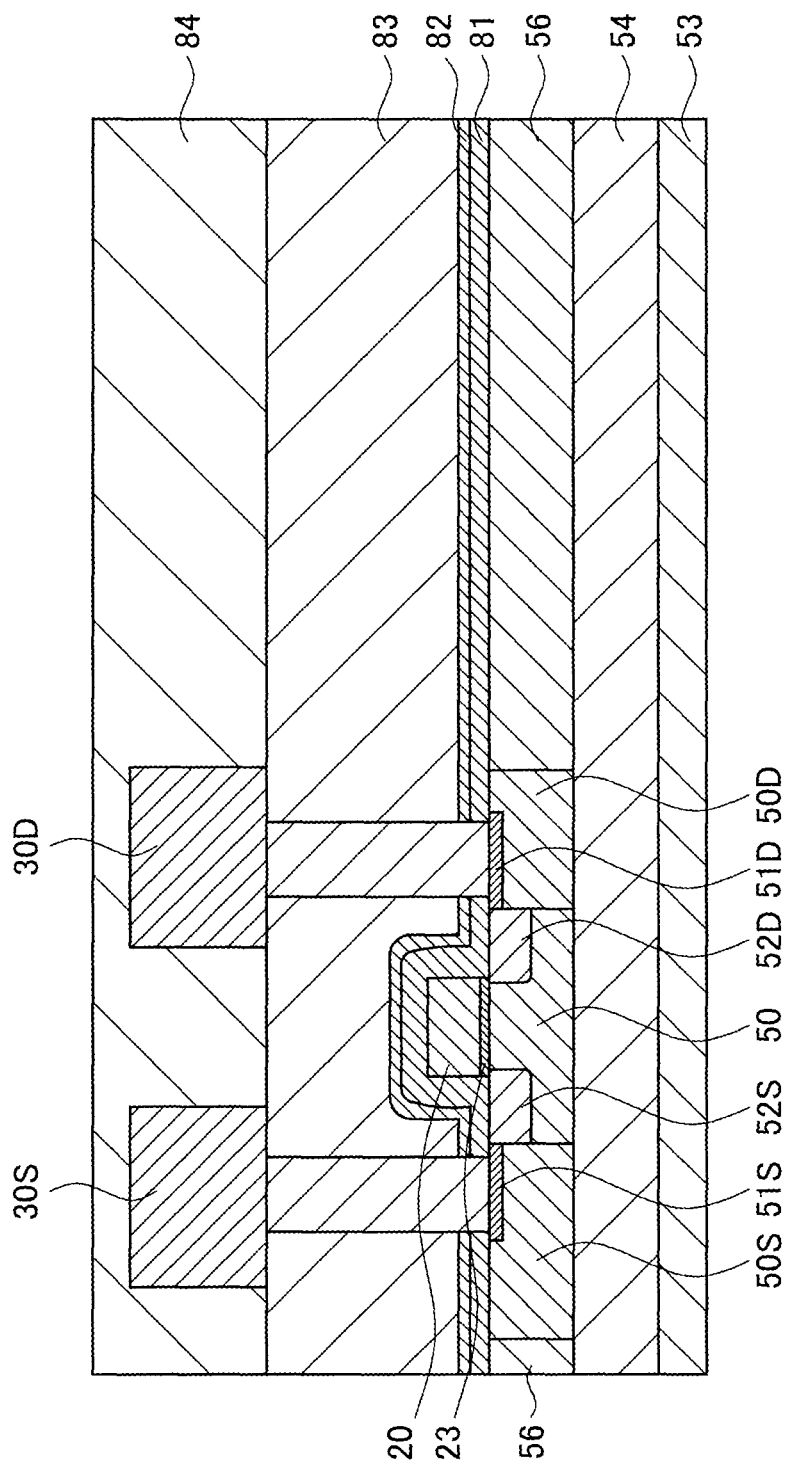
FIG. 26 is a cross-sectional view in a stacking direction showing a manufacturing process of a semiconductor device according to the embodiment.

Subsequently, as shown in FIG. 26, the source electrode 30S and the drain electrode 30D containing aluminum (Al) (corresponding to the first metal M1) are formed on the contact plugs 60S and 60D. Further, after the source electrode 30S and the drain electrode 30D are formed, the fourth insulating layer 84 containing silicon oxide is formed on the third insulating layer 83, the source electrode 30S, and the drain electrode 30D by the CVD method or the like.

Figure 27:
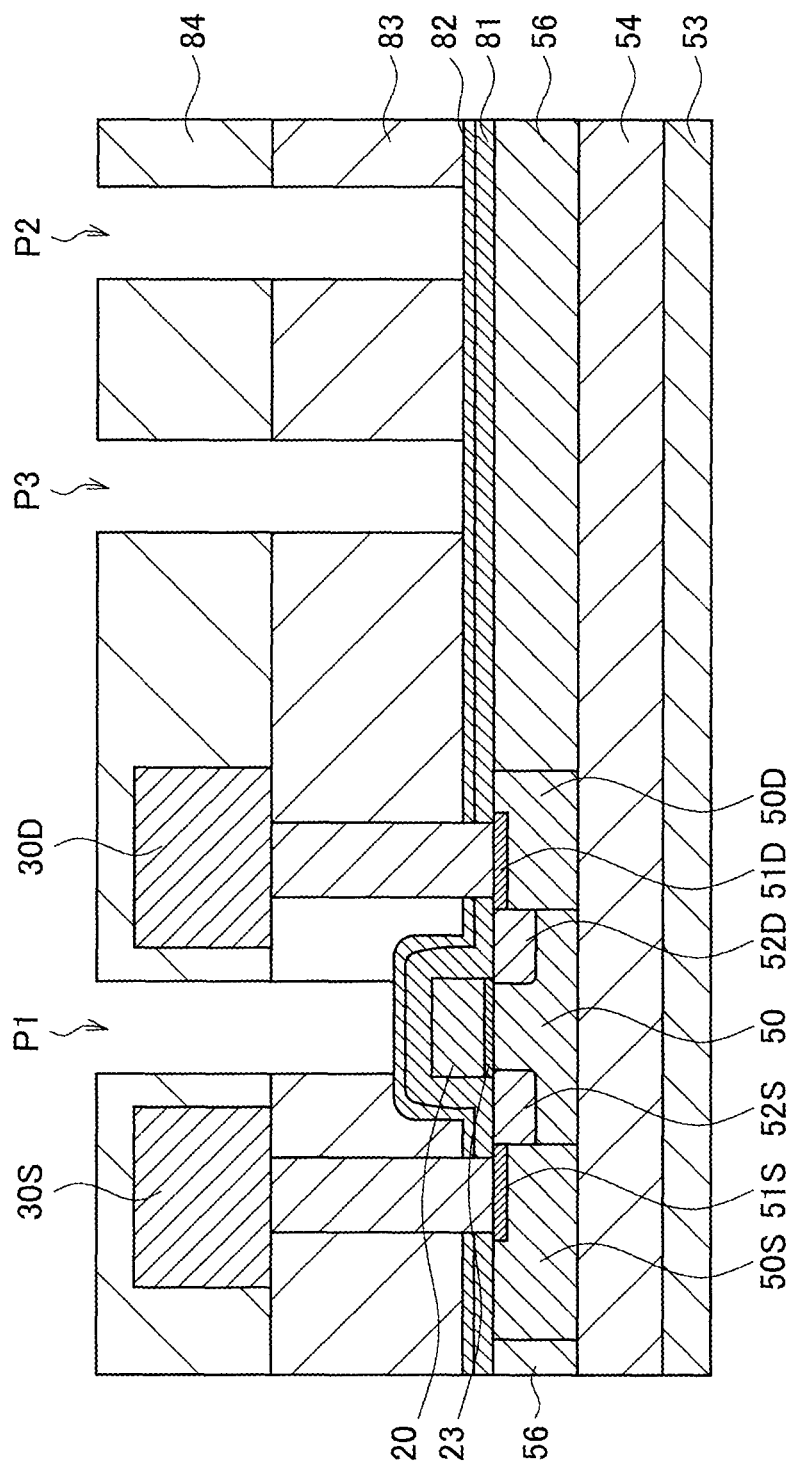
FIG. 27 is a cross-sectional view in a stacking direction showing a manufacturing process of a semiconductor device according to the embodiment.

Next, as shown in FIG. 27, after the fourth insulating layer 84 is formed, openings P1, P2, and P3 are formed by photolithography and dry etching. The opening P1 is formed in a region of the semiconductor layer 50 between the source electrode 30S and the drain electrode 30D. Further, the openings P2 and P3 are formed in regions on which the metal layers 32 and 33 will be formed in subsequent processes. Note that the width of each of the openings P1, P2, and P3 may be, for example, 100 nm to 1000 nm.

In this event, the second insulating layer 82 functions as an etching stopper; thus, the etching of the openings P1, P2, and P3 proceeds to pierce the fourth insulating layer 84 and the third insulating layer 83 containing silicon oxide, and stops at the upper surface of the second insulating layer 82.

Figure 28:
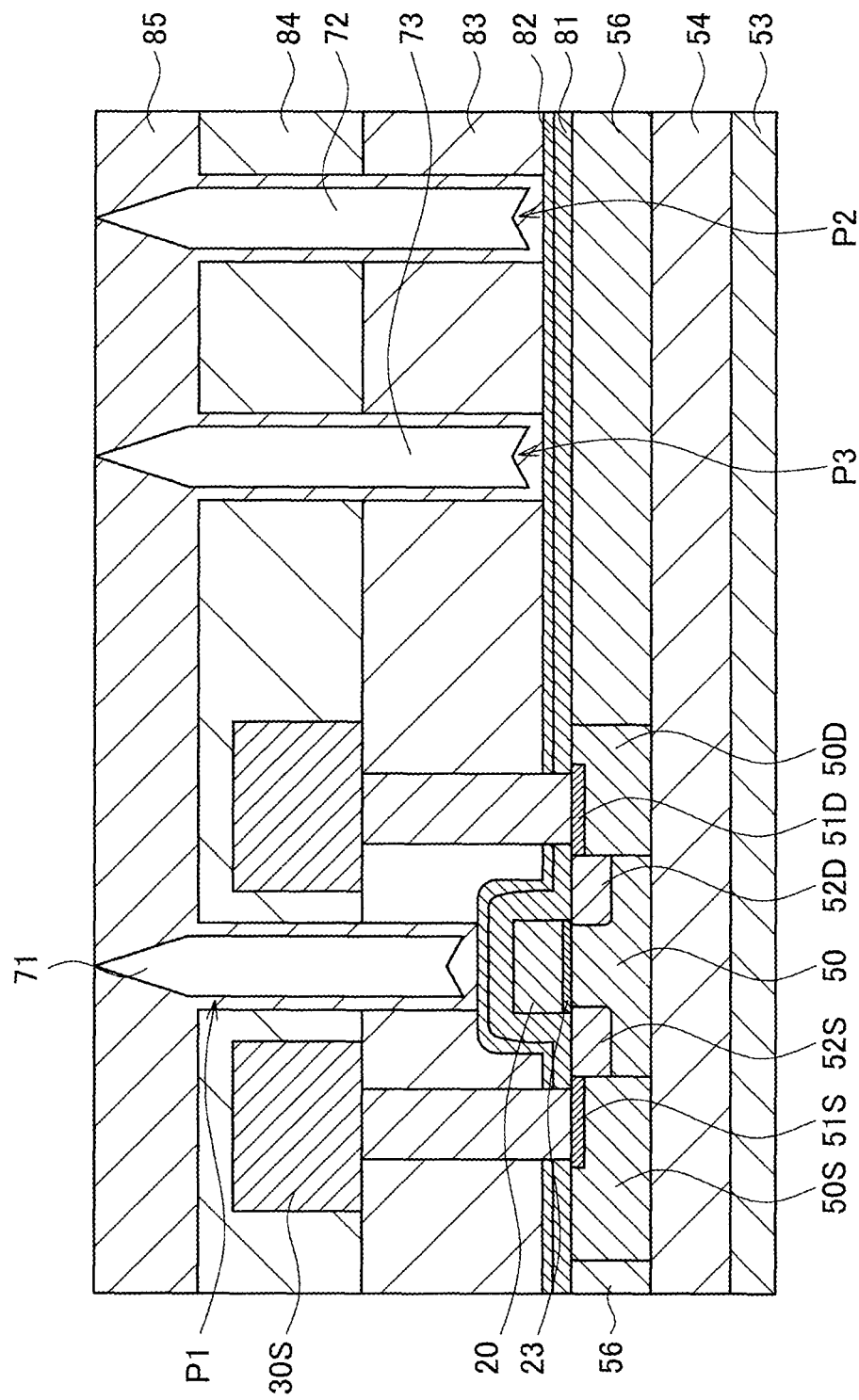
FIG. 28 is a cross-sectional view in a stacking direction showing a manufacturing process of a semiconductor device according to the embodiment.

Subsequently, as shown in FIG. 28, the fifth insulating layer 85 containing silicon oxide is formed on the fourth insulating layer 84 by the CVD method or the like, for example. The fifth insulating layer 85 deposits so as to cover the upper sides of the openings P1, P2, and P3. Thus, the upper sides of the openings P1, P2, and P3 are sealed before the openings P1, P2, and P3 are filled with the fifth insulating layer 85, and the low-permittivity layers 71, 72 and 73 that are spaces are formed in the interiors of the opening P1, P2, and P3. Note that the side surface and the bottom surface of each of the openings P1, P2, and P3 may be covered with the fifth insulating layer 85.

Therefore, in a case where the low-permittivity layers 71, 72 and 73 are formed simultaneously, at least either of the upper ends and the lower ends of the low-permittivity layers 71, 72 and 73 are provided in the same layer. In the case where the low-permittivity layers 71, 72 and 73 are formed simultaneously, the manufacturing process of the semiconductor device 10 can be simplified.

Each of the low-permittivity layers 71, 72 and 73 is, for example, a space, and therefore has a lower permittivity than the third insulating layer 83, the fourth insulating layer 84, and the fifth insulating layer 85 (for example, silicon oxide). Note that air may be present in each of the low-permittivity layers 71, 72 and 73, or each of them may be a vacuum.

Further, the low-permittivity layers 71, 72 and 73 may be formed also by filling the interiors of the openings P1, P2, and P3 with a material (for example, SiOC, inorganic SOG, organic SOG, and the like) having a lower permittivity than the third insulating layer 83, the fourth insulating layer 84, and the fifth insulating layer 85 (for example, silicon oxide). For example, the low-permittivity layers 71, 72 and 73 may be formed by filling the openings P1, P2, and P3 with SiOC by the CVD method or the like. Further, the low-permittivity layers 71, 72, and 73 may be formed by filling the openings P1, P2, and P3 with inorganic or organic SOG by the spin coating method or the like.

Figure 29:
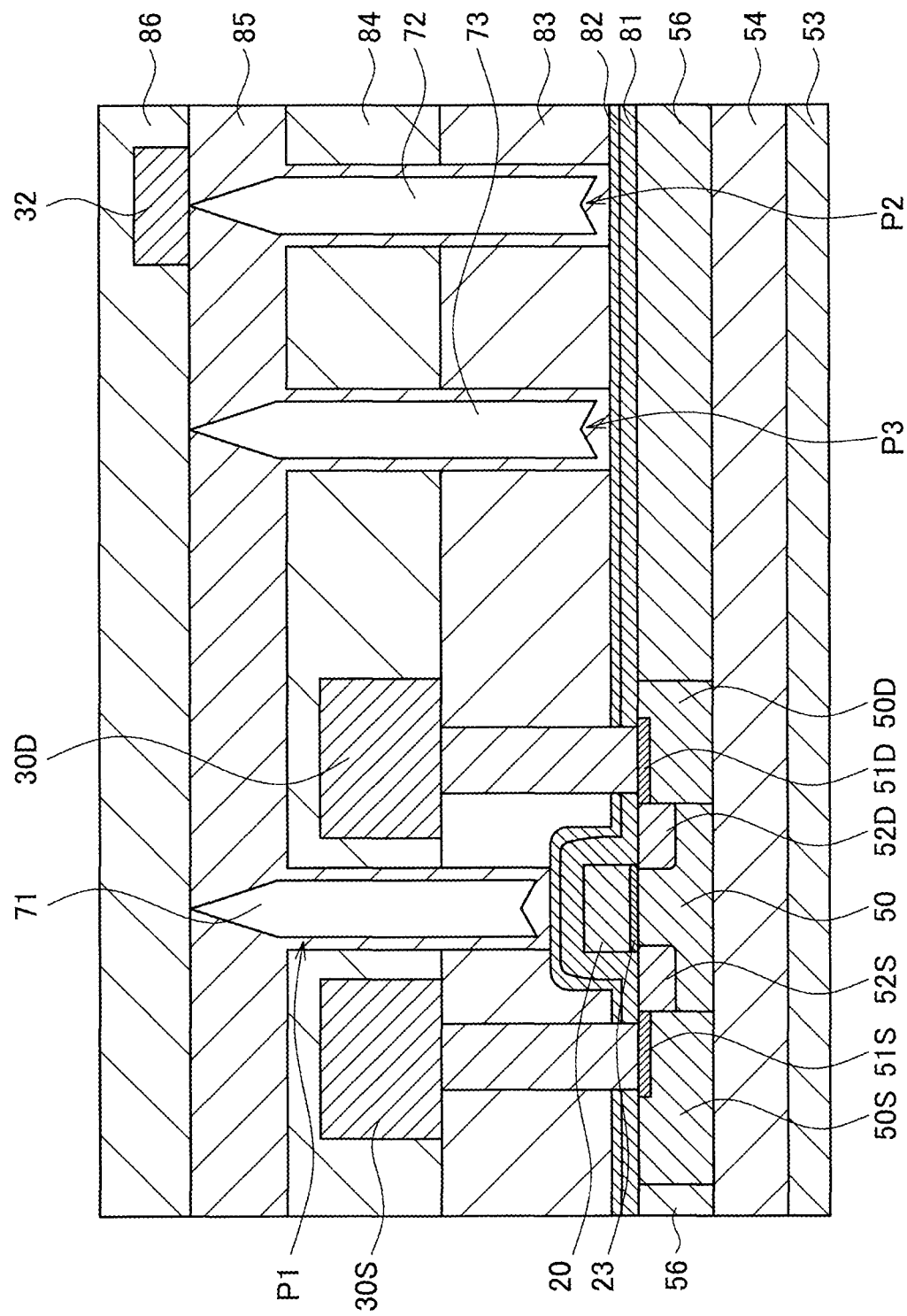
FIG. 29 is a cross-sectional view in a stacking direction showing a manufacturing process of a semiconductor device according to the embodiment.

Next, as shown in FIG. 29, the metal layer 32 containing aluminum (Al) is formed in an area on the fifth insulating layer 85 and above the region where the low-permittivity layer 72 is formed. The metal layer 32 is an interconnection layer to be connected to any of various electrodes of field effect transistors, and corresponds to the second metal. Further, the sixth insulating layer 86 containing silicon oxide is formed on the metal layer 32 and the fifth insulating layer 85 by the CVD method or the like.

Figure 30:
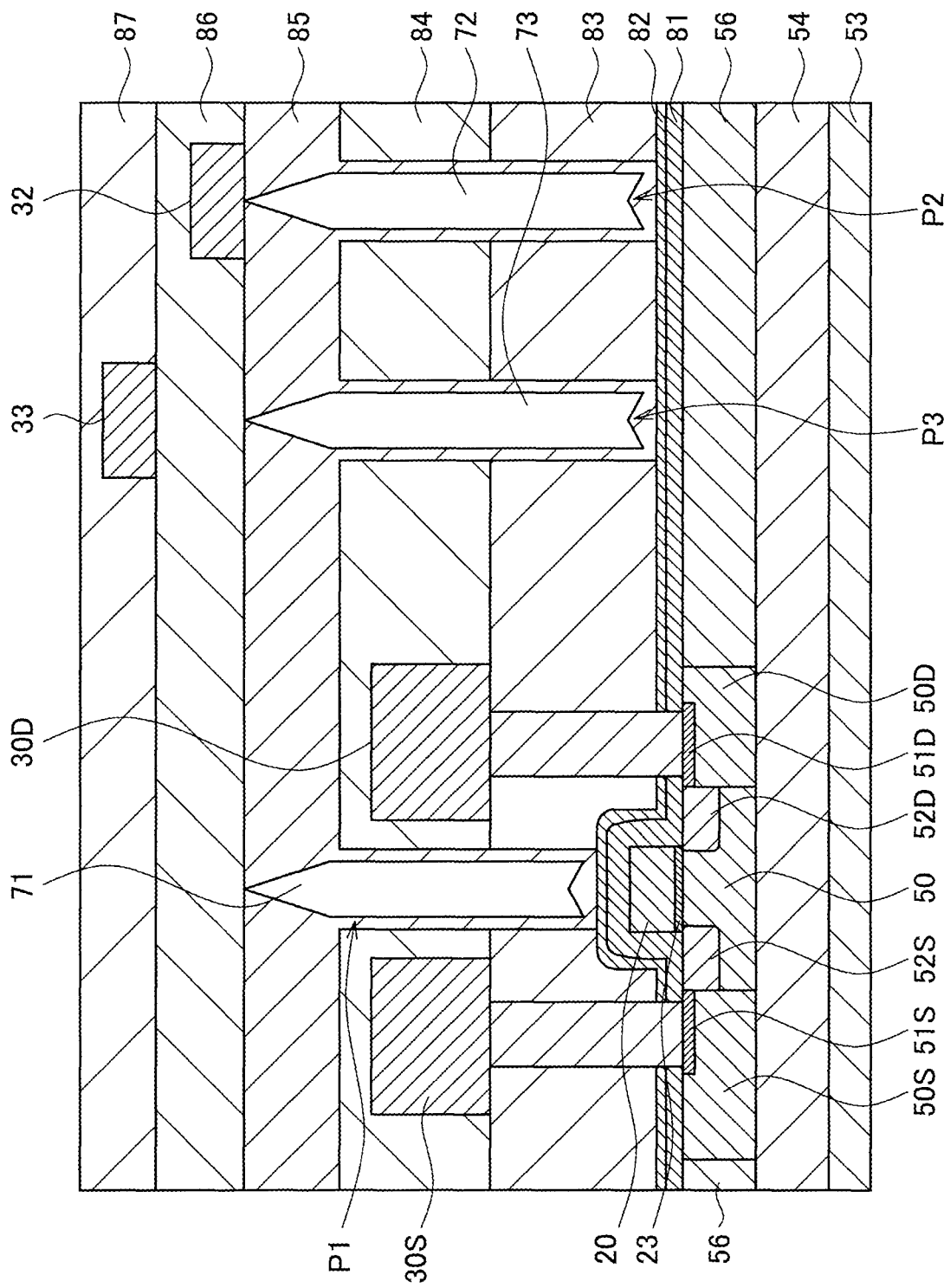
FIG. 30 is a cross-sectional view in a stacking direction showing a manufacturing process of a semiconductor device according to the embodiment.

Subsequently, as shown in FIG. 30, the metal layer 33 containing aluminum (Al) is formed in an area on the sixth insulating layer 86 and above the region where the low-permittivity layer 73 is formed. The metal layer 33 is an interconnection layer, a pad electrode, or the like to be connected to any of various electrodes of field effect transistors, and corresponds to the third metal. Further, the seventh insulating layer 87 containing silicon oxide is formed on the metal layer 33 and the sixth insulating layer 86 by the CVD method or the like.

By the above process, the semiconductor device 10 according to the present embodiment can be manufactured. The semiconductor device 10 according to the present embodiment can reduce the capacitances having nonlinearity between the metal layers 32 and 33, each of which is at least one of an interconnection and an electrode, and the support substrate 53. Thereby, nonlinearity is reduced in the semiconductor device 10 according to the present embodiment; therefore, in a circuit using the semiconductor device 10, the generation of a signal other than an input or output signal (that is, a distortion of a signal) can be suppressed.

Note that the shape, material, thickness, film formation method, etc. of each of the layers described in the above embodiment are not limited to the above examples, and it goes without saying that other shapes, materials, thicknesses, and film formation methods may be used.

3. Usage Example

Figure 31:
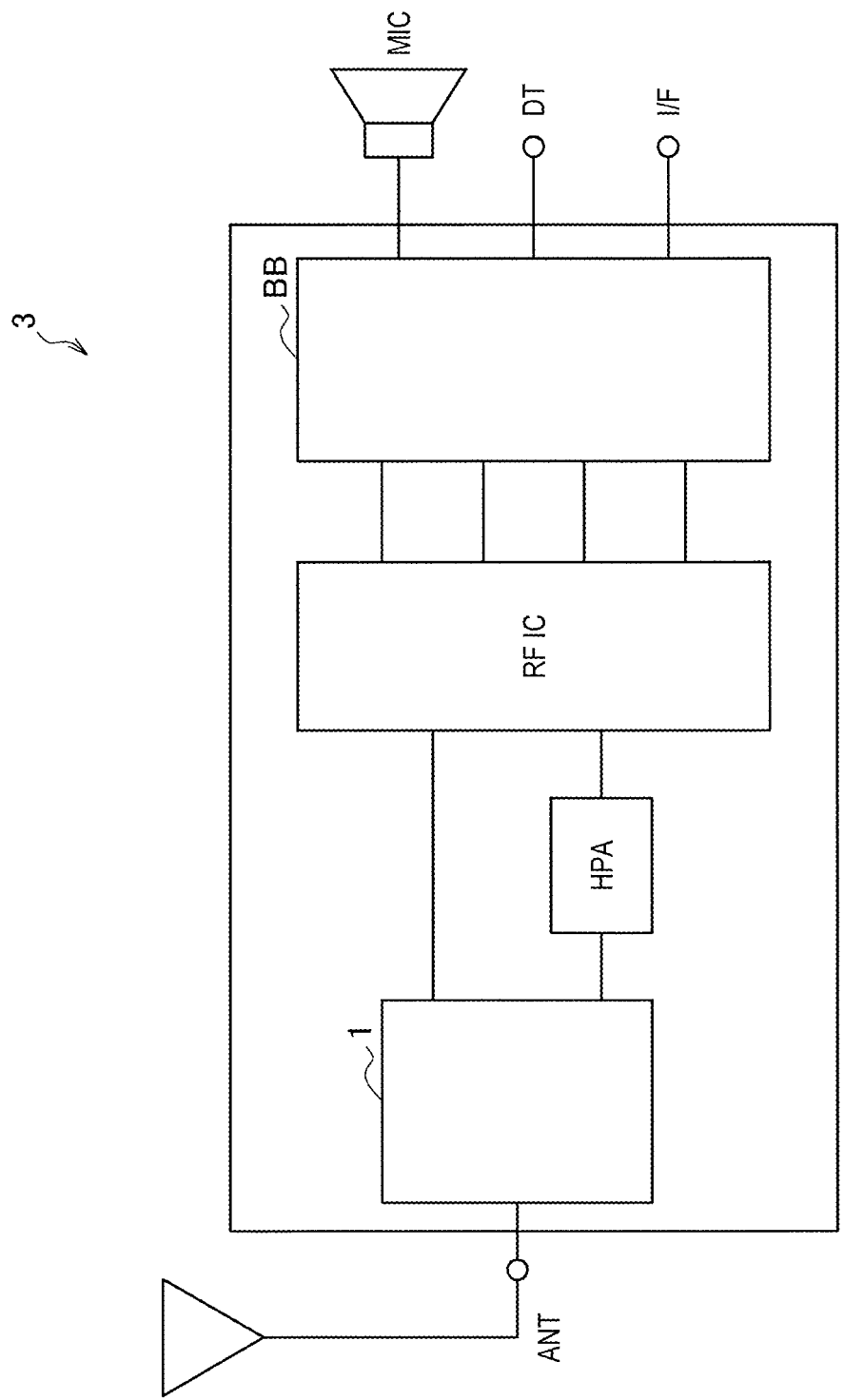
FIG. 31 is a block diagram showing an example of a wireless communication device that is a usage example of a semiconductor device according to the embodiment.

Further, a usage example of the semiconductor device 10 according to the present embodiment is described with reference to FIG. 31. FIG. 31 is a block diagram showing an example of a wireless communication device that is a usage example of the semiconductor device 10 according to the present embodiment.

As shown in FIG. 31, a wireless communication device 3 is, for example, a mobile phone system having functions such as voice and data communication and local area network (LAN) connection. The wireless communication device 3 includes, for example, an antenna ANT, the radio frequency switch 1, a high power amplifier HPA, a radio frequency integrated circuit RFIC, a base band section BB, a voice output section MIC, a data output section DT, and an external interface section I/F (for example, a wireless LAN, Bluetooth (registered trademark), or the like).

The radio frequency switch 1 includes, for example, the radio frequency switch described in any of FIGS. 1, 2 and 7. Further, the radio frequency integrated circuit RFIC and the base band section BB are connected together by an internal interface.

In a case where a transmission signal is outputted to the antenna ANT from a transmission system in the wireless communication device 3, the transmission signal outputted from the base band section BB is outputted to the antenna ANT via the radio frequency integrated circuit RFIC, the high power amplifier HPA, and the radio frequency switch 1.

Further, in a case where a reception signal is inputted to a reception system in the wireless communication device 3, the reception signal received by the antenna ANT is inputted to the base band section BB via the radio frequency switch 1 and the radio frequency integrated circuit RFIC. The reception signal processed by the base band section BB is outputted from output sections such as the voice output section MIC, the data output section DT, and the external interface section I/F.

Note that, although in the above a case where the semiconductor device 10 according to the present embodiment is used for the radio frequency switch 1 of the wireless communication device 3 is described, the technology according to the present disclosure is not limited to the above. For example, the semiconductor device 10 according to the present embodiment can be used also for radio frequency devices other than a radio frequency switch (RF-SW), such as an amplifier (power amplifier, PA).

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A semiconductor device including:

a transistor region in which a field effect transistor is provided; and an interconnection region in which a metal layer electrically connected to the field effect transistor is provided, in which the interconnection region includes an insulating layer provided between the metal layer and a substrate, and a low-permittivity layer provided in the insulating layer below the metal layer and having a lower permittivity than the insulating layer.

(2)

The semiconductor device according to (1), in which a plurality of the low-permittivity layers are provided, and the low-permittivity layers are arranged in a striped fashion.

(3)

The semiconductor device according to (1), in which a plurality of the low-permittivity layers are provided, and the low-permittivity layers are arranged in a zigzag fashion.

(4)

The semiconductor device according to any one of (1) to (3), in which a plurality of the insulating layers are provided, and the low-permittivity layer is provided in each of the insulating layers.

(5)

The semiconductor device according to (4), in which the low-permittivity layers which are provided in the insulating layers are arranged so as not to overlap when a planar view of the substrate is viewed, (6)

The semiconductor device according to (5), in which the low-permittivity layers provided in the insulating layers are arranged in a zigzag fashion when a planar view of the substrate is viewed.

(7)

The semiconductor device according to any one of (1) to (3), in which the low-permittivity layer is provided to pierce up to the substrate.

(8)

The semiconductor device according to any one of (1) to (7), in which an upper-side metal layer is further provided on the metal layer via an inter-metal insulating layer, and an inter-metal low-permittivity layer having a lower permittivity than the inter-metal insulating layer is provided in the inter-metal insulating layer between the metal layer and the upper-side metal layer.

(9)

The semiconductor device according to any one of (1) to (8), in which the low-permittivity layer is provided at least in a projection region of the metal layer when a planar view of the substrate is viewed.

(10)

The semiconductor device according to any one of (1) to (9), in which the metal layer is one of an interconnection and an electrode electrically connected to the field effect transistor.

(11)

The semiconductor device according to any one of (1) to (10), in which a plurality of the low-permittivity layers are provided, and at least either of upper ends and lower ends of the low-permittivity layers are provided in a same layer.

(12)
The semiconductor device according to any one of (1) to (11),
in which the field effect transistor is a field effect transistor for a radio frequency device.

(13)
A method for manufacturing a semiconductor device, including:
a step of forming a field effect transistor in a transistor region;
a step of filling, with an insulating layer, an interconnection region in which a metal layer to be electrically connected to the field effect transistor is to be provided and the transistor region;
a step of forming, in the insulating layer, a low-permittivity layer having a lower permittivity than the insulating layer; and
a step of forming the metal layer on the low-permittivity layer.

REFERENCE SIGNS LIST 1 radio frequency switch
10 semiconductor device
20 gate electrode
23 gate oxide film
30D drain electrode
30S source electrode
32, 33, 34 metal layer
50 semiconductor layer
50D drain region
50S source region
51D, 51S low-resistance region
52D, 52S extension region
53 support substrate
54 embedded oxide film
56 element isolation layer
60D, 60S contact plug
71, 72, 73 low-permittivity layer
81 first insulating layer
82 second insulating layer
83 third insulating layer
84 fourth insulating layer
85 fifth insulating layer
86 sixth insulating layer
87 seventh insulating layer

What is claimed is:
1. A semiconductor device comprising:
a transistor region in which a field effect transistor is provided; and
an interconnection region comprising a first metal layer and a second metal layer,
wherein the interconnection region includes:
an interlayer insulating layer provided above a substrate, wherein the interlayer insulating layer includes a plurality of insulating layers;
a first low-permittivity layer provided in the interlayer insulating layer directly below the first metal layer; and
a second low-permittivity layer provided in the interlayer insulating layer directly below the second metal layer, wherein:
the first metal layer is formed on a first insulating layer of the plurality of insulating layers and is electrically connected to the field effect transistor,
the second metal layer is formed on a second insulating layer of the plurality of insulating layers and is electrically connected to the field effect transistor,
each of the first and second low-permittivity layers comprise a material having a lower permittivity than the interlayer insulating layer,
the first low-permittivity layer and the second low-permittivity layer do not overlap in a plan view, and
each of the first low-permittivity layer and the second low-permittivity layer extends across the plurality of insulating layers.

2. The semiconductor device according to claim 1, wherein the first and second low-permittivity layers are arranged in a striped fashion.

3. The semiconductor device according to claim 1, wherein the first and second low-permittivity layers are arranged in a zigzag fashion.

4. The semiconductor device according to claim 1, wherein one of the first and second low-permittivity layers is provided in each of the insulating layers.

5. The semiconductor device according to claim 4, wherein the first and second low-permittivity layers are arranged in a zigzag fashion in the plan view.

6. The semiconductor device according to claim 1, wherein the first and second low-permittivity layers are provided to pierce up to the substrate.

7. The semiconductor device according to claim 1, wherein an upper-side metal layer is further provided on the first metal layer via an inter-metal insulating layer, and
wherein an inter-metal low-permittivity layer of a material having a lower permittivity than the inter-metal insulating layer is provided in the inter-metal insulating layer between the first metal layer and the upper-side metal layer.

8. The semiconductor device according to claim 1, wherein at least one of the first and second low-permittivity layers is provided at least in a projection region of the first metal layer in the plan view.

9. The semiconductor device according to claim 1, wherein the first metal layer is an interconnection electrically connected to the field effect transistor.

10. The semiconductor device according to claim 1, wherein either of an upper end and a lower end of the each of the first and second low-permittivity layers are provided in a same layer.

11. The semiconductor device according to claim 1, wherein the field effect transistor is associated with a radio frequency device.

12. A method for manufacturing a semiconductor device, comprising:
forming a field effect transistor in a transistor region;
filling, with an interlayer insulating layer, an interconnection region comprising a first metal layer and a second metal layer, wherein the interlayer insulating layer is provided above a substrate, wherein the interlayer insulating layer includes a plurality of insulating layers;
forming, in the interlayer insulating layer directly below the first metal layer, a first low-permittivity layer; and
forming, in the interlayer insulating layer directly below the second metal layer, a second low-permittivity layer, wherein:
the first metal layer is formed on a first insulating layer of the plurality of insulating layers and is electrically connected to the field effect transistor, the second metal layer is formed on a second insulating layer of the plurality of insulating layers and is electrically connected to the field effect transistor, each of the first and second low-permittivity layers comprise a material having a lower permittivity than the interlayer insulating layer, the first and second low-permittivity layers do not overlap in a plan view, and each of the first and second low-permittivity layers extends across the plurality of insulating layers.

* * * * *